United States Patent
Nakano et al.

(10) Patent No.: US 11,750,981 B2
(45) Date of Patent: Sep. 5, 2023

(54) TRANSDUCER AND METHOD FOR MANUFACTURING SAME

(71) Applicant: Sumitomo Riko Company Limited, Aichi (JP)

(72) Inventors: Katsuhiko Nakano, Aichi (JP); Masaki Nasu, Aichi (JP); Koichi Hasegawa, Aichi (JP); Shinya Tahara, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 895 days.

(21) Appl. No.: 16/595,522

(22) Filed: Oct. 8, 2019

(65) Prior Publication Data

US 2020/0053482 A1    Feb. 13, 2020

Related U.S. Application Data

(63) Continuation of application No. PCT/JP2018/036242, filed on Sep. 28, 2018.

(30) Foreign Application Priority Data

Sep. 29, 2017   (JP) ................................. 2017-191447
Dec. 27, 2017   (JP) ................................. 2017-251418

(Continued)

(51) Int. Cl.
*B06B 1/02*      (2006.01)
*G01D 5/241*     (2006.01)
(Continued)

(52) U.S. Cl.
CPC ....... *H04R 19/00* (2013.01); *B60R 21/01552* (2014.10); *B62D 1/046* (2013.01);
(Continued)

(58) Field of Classification Search
CPC ............ H04R 19/00–04; B06B 1/0292; B06H 1/0292; B62D 1/046
See application file for complete search history.

(56) References Cited

U.S. PATENT DOCUMENTS

| | | | |
|---|---|---|---|
| 5,682,075 A | 10/1997 | Bolleman et al. | |
| 8,243,975 B2 * | 8/2012 | Akino | H04R 1/086 |
| | | | 381/174 |

(Continued)

FOREIGN PATENT DOCUMENTS

| | | | | |
|---|---|---|---|---|
| CN | 101400013 | * | 4/2009 | ............. H04R 19/02 |
| CN | 108302453 | | 7/2018 | |

(Continued)

OTHER PUBLICATIONS

Office Action of Japan Counterpart Application, with English translation thereof, dated Aug. 2, 2022, pp. 1-11.

(Continued)

*Primary Examiner* — John A Bodnar
(74) *Attorney, Agent, or Firm* — JCIPRNET

(57) ABSTRACT

Provided is a transducer that can be manufactured without using a volatile adhesive or an organic solvent. A transducer is provided with: a first electrode sheet provided with a plurality of first through-holes; a dielectric layer, of which a first surface is disposed on the first-electrode-sheet side; and a first fusion-bonding layer formed from a fusion-bonding material, the first fusion-bonding layer joining together, by fusion bonding of the fusion-bonding material, a boundary region between a body portion of the dielectric layer and a first inner surface of the first electrode sheet and a boundary region between the body portion of the dielectric layer and a first inner circumferential surface of at least some of the plurality of first through-holes.

26 Claims, 12 Drawing Sheets

(30) Foreign Application Priority Data

Jun. 29, 2018 (JP) ................................. 2018-124273
Sep. 12, 2018 (JP) ................................. 2018-170510

(51) Int. Cl.

| | |
|---|---|
| B60R 21/015 | (2006.01) |
| H04R 19/00 | (2006.01) |
| B62D 1/04 | (2006.01) |
| B62D 1/06 | (2006.01) |
| H10N 30/857 | (2023.01) |
| H10N 30/87 | (2023.01) |

(52) U.S. Cl.

CPC ........... B62D 1/065 (2013.01); H10N 30/857 (2023.02); H10N 30/877 (2023.02)

(56) References Cited

U.S. PATENT DOCUMENTS

| | | | |
|---|---|---|---|
| 2005/0242965 A1 | 11/2005 | Rieth et al. | |
| 2012/0014543 A1* | 1/2012 | Chiang | H04R 19/013 381/191 |
| 2014/0321675 A1* | 10/2014 | Nakano | H04R 19/02 381/162 |
| 2017/0282955 A1 | 10/2017 | Morita | |
| 2018/0010755 A1 | 1/2018 | Park et al. | |

FOREIGN PATENT DOCUMENTS

| | | |
|---|---|---|
| EP | 2043386 | 4/2009 |
| JP | S60186800 | 12/1985 |
| JP | S63303525 | 12/1988 |
| JP | H05172839 | 7/1993 |
| JP | H06323929 | 11/1994 |
| JP | 3105645 | 11/2000 |
| JP | 2005537992 | 12/2005 |
| JP | 2010089496 | 4/2010 |
| JP | 2014027756 | 2/2014 |
| JP | 2014239647 | 12/2014 |
| JP | 6085356 | 2/2017 |
| JP | 2017178135 | 10/2017 |

OTHER PUBLICATIONS

"Written Opinion of the International Searching Authority (Form PCT/ISA/237)" of PCT/JP2018/036242, dated Jan. 8, 2019, with English translation thereof, pp. 1-23.
"Search Report of Europe Counterpart Application", dated Feb. 20, 2020, p. 1-p. 9.
"Office Action of China Counterpart Application", dated Nov. 4, 2020, with English translation thereof, p. 1-p. 18.
"Office Action of Japan Counterpart Application" with English translation thereof, dated May 10, 2022, p. 1-p. 6.
"International Search Report (Form PCT/ISA/210) of PCT/JP2018/036242," dated Jan. 8, 2019, with English translation thereof, pp. 1-4.
"Office Action of China Counterpart Application", dated Jun. 23, 2021, with English translation thereof, pp. 1-16.
Office Action of European Counterpart Application, dated Apr. 9, 2021, pp. 1-14.
"Office Action of China Counterpart Application" with English translation thereof, dated Jan. 6, 2022, p. 1-p. 13.

\* cited by examiner

TRANSDUCER AND METHOD FOR MANUFACTURING SAME

CROSS-REFERENCE TO RELATED APPLICATION

The present application is a continuation of PCT/JP2018/036242, filed on Sep. 28, 2018, and is related to and claims priority from Japanese patent application no. 2017-191447, filed on Sep. 29, 2017, Japanese patent application no. 2017-251418, filed on Dec. 27, 2017, Japanese patent application no. 2018-124273, filed on Jun. 29, 2018, and Japanese patent application no. 2018-170510, filed on Sep. 12, 2018. The entire contents of the aforementioned application are hereby incorporated by reference herein.

BACKGROUND

Technical Field

The present disclosure relates to a transducer and a method for manufacturing the same.

Description of Related Art

Patent Literature 1 discloses a piezoelectric element in which an electrode in the form of a porous sheet is buried in a polymer piezoelectric body. The piezoelectric element is manufactured by treating a surface of a polymer piezoelectric film or sheet with an organic solvent such as acetone and then laminating and pressure-bonding the electrode in the form of a porous sheet on the treated surface.

Patent Literature 2 discloses a piezoelectric-type vibration sensor provided with a piezoelectric film, two mesh-shaped electrodes disposed on both surfaces of the piezoelectric film, and two support plates formed from plate-shaped rigid bodies on both outer sides of the respective electrodes.

Incidentally, automatic driving of vehicles has spread in recent years. As one of automatic driving state levels, there is a level in which a driver is required to keep his/her hands in contact with a steering wheel. Thus, provision of a sensor at the steering wheel has been examined. There is a mechanism in which the sensor is wound around the surface of the steering wheel and covers the sensor by sewing thereof. However, manufacturing costs significantly increase in a case in which sewing is performed on the steering wheel. Therefore, a method in which sewing is not performed, for example, a method of disposing a sensor through injection molding or the like is desired in order to reduce the manufacturing costs. Also, there is a need for the sensor to be secured to the steering wheel in order to perform injection molding. Further, reduction of volatile organic compounds (VOC) discharge as an action for the environment has been required in recent years. For this purpose, it is desired not to use a volatilization-type adhesive and an organic solvent to secure the sensor.

Patent Literature 3 discloses provision of an electrostatic capacitive sensor or a piezoelectric element on the surface of the steering wheel in order to detect contact of driver's hands with the steering wheel. More specifically, a steering wheel provided with an electrostatic capacitive sensor includes a ring-shaped core body made of metal, a synthetic resin cover provided around the core body, a conductive metal woven fabric disposed in a foaming material disposed around the synthetic resin cover, and leather that covers the foaming material. The metal woven fabric forms an electrostatic capacitance along with the ring-shaped core body made of metal.

Patent Literature 4 discloses provision of a heater element around a ring-shaped core body, which is made of metal, of the steering wheel. The heater element includes a thermal insulation sheet, a foaming sheet, and a linear heater disposed so as to be sandwiched between the thermal insulation sheet and the foaming sheet. The heater element is bonded to the core body using an adhesive layer formed on the surface of the thermal insulation sheet. In addition, the core body is made in a state in which the heater element is wound therearound, and a cover layer for covering the periphery of the heater element is molded through injection molding.

Patent Literature 5 discloses provision of a heater element on a side of a surface of a steering wheel. The heater element includes a support frame and an electrically heated wire attached to the support frame. In addition, the support frame to which the electrically heated wire is attached is inserted into a mold in a state in which a core body made of metal is caused to support the support frame, a molding material is poured in, and a cover layer for covering the periphery of the heater element is foaming-molded.

As described above, reduction of volatile organic compounds (VOC) discharge has been required as an action for the environment in recent years. Therefore, it is desired not to use a volatilization-type adhesive and not to use an organic solvent.

Also, a transducer using an electrostatic capacitance between electrodes unlike a structure using a piezoelectric effect has attracted attention. The electrostatic capacitance of an electrostatic transducer differs depending on a material of a dielectric body. In a case in which a surface of a polymer dielectric body is treated with an organic solvent and electrodes are pressure-bonded thereto, constituents of the organic solvent remain at the pressure-bonded portion. There is concern that the remaining constituents of the organic solvent may affect the electrostatic capacitance. As a result, there is concern that an intended electrostatic capacitance may not be able to be obtained due to the influence of the remaining constituents of the organic solvent.

In addition, the electrostatic transducer is required to have not only flexibility but also stretchability in order to enable attachment to various portions. In a case in which an attachment target has various shapes such as a freely curved surface and a transducer manufactured into a planar shape is attached along the surface of the attachment target, for example, the flexibility and the stretchability of the transducer are significant and important factors. If the transducer does not have flexibility and stretchability, it may not be possible to neatly attach the transducer to an attachment target with a freely curved surface.

Further, there is a concern that in the case in which a volatilization-type adhesive and an organic solvent are used as described above, constituents of the volatilization-type adhesive and the organic solvent may affect the flexibility and stretchability of the transducer. Therefore, it is still desired not to use a volatilization-type adhesive and an organic solvent in terms of flexibility and stretchability.

Also, utilization of a support frame that is a member separate from a sensor or an actuator for the purpose of attaching the sensor or the actuator to an attachment target (a core body of a steering wheel or the like) leads to an increase in costs. Therefore, attachment of the sensor or the actuator to the attachment target without using a support frame in order to attach the sensor or the actuator to the attachment target is required.

CITATION LIST

Patent Literature

[Patent Literature 1]: Japanese Patent No. 3105645
[Patent Literature 2]: Japanese Patent Laid-Open No. H5-172839
[Patent Literature 3]: Japanese Patent Laid-Open No. 2005-537992
[Patent Literature 4]: Japanese Patent Laid-Open No. 2017-178135
[Patent Literature 5]: Japanese Patent No. 6085356

SUMMARY

An aspect of the disclosure is to provide a transducer that can be manufactured without using a volatilization-type adhesive and an organic solvent and a method for manufacturing the same. Also, another aspect of the disclosure is to provide a transducer with flexibility and stretchability and a method for manufacturing the same.

(1. First Transducer)

A first transducer includes: a first electrode sheet provided with a plurality of first through-holes; a dielectric layer with a first surface that is disposed on a side of the first electrode sheet; and a fusion-bonding layer formed from a fusion-bonding material, the fusion-bonding layer joining together, by fusion-bonding of the fusion-bonding material, a boundary region between a body portion of the dielectric layer and a first inner surface of the first electrode sheet and a boundary region between the body portion of the dielectric layer and a first inner circumferential surface of at least some of the plurality of first through-holes.

According to the first transducer, the body portion of the dielectric layer and the first electrode sheet are joined by fusion-bonding of the fusion-bonding material. Since the fusion-bonding material is neither a volatilization-type adhesive nor an organic solvent, the first transducer can be manufactured without using either of a volatilization-type adhesive or an organic solvent. Therefore, it is possible to reduce VOC discharge in the manufacturing of the first transducer. Here, a case in which the first fusion-bonding layer is formed using a fusion-bonding material as a part of the material of the dielectric layer includes a case in which a fusion-bonding material that is different from that of the dielectric layer is used.

(2. Second Transducer)

A second transducer includes: a first electrode sheet provided with a plurality of first through-holes; a second electrode sheet provided with a plurality of second through-holes and disposed so as to face the first electrode sheet; a first dielectric layer that is integrally and mechanically engaged with the first electrode sheet on a side of a first inner surface; a second dielectric layer integrally and mechanically engaged with the second electrode sheet on a side of a second inner surface and joined directly or indirectly to the first dielectric layer; and an intermediate fusion-bonding layer formed from a fusion-bonding material, the intermediate fusion-bonding layer joining directly or indirectly, by fusion-bonding of the fusion-bonding material, a first body portion of the first dielectric layer and a second body portion of the second dielectric layer.

According to the second transducer, the first body portion of the first dielectric layer and the second body portion of the second dielectric layer are joined directly or indirectly to each other by the fusion-bonding of the fusion-bonding material. Since the fusion-bonding material is neither a volatilization-type adhesive nor an organic solvent, the second transducer can be manufactured without using a volatilization-type adhesive or an organic solvent. Therefore, it is possible to reduce VOC discharge in the manufacturing of the second transducer. Here, a case in which the intermediate fusion layer is formed using the fusion-bonding material for a part of at least one of the material of the first dielectric layer and the material of the second dielectric layer includes a case in which a fusion-bonding material that is different from those of the first dielectric layer and the second dielectric layer is used.

(3. Third Transducer)

A third transducer includes: a conductive member; and an electrostatic sheet provided in a surface normal line direction of the conductive member. The electrostatic sheet includes a first electrode sheet provided with a plurality of through-holes, and a dielectric layer with a first surface disposed on a side of the first electrode sheet and a second surface disposed on a side of the conductive member. The dielectric layer on a side of the first surface is joined directly or indirectly to the first electrode sheet through any of fusion-bonding of a part of a material of the dielectric layer, fusion-bonding of a first fusion-bonding material that is different from the material of the dielectric layer, and mechanical engagement of the dielectric layer itself. In addition, the dielectric layer on a side of the second surface is joined directly or indirectly to the conductive member through any of fusion-bonding of a part of a material of the dielectric layer and fusion-bonding of a second fusion-bonding material that is different from the material of the dielectric layer.

The electrostatic sheet includes the first electrode sheet and the dielectric layer, and both the first electrode sheet and the dielectric layer are joined to each other. The first electrode sheet and the dielectric layer are joined to each other through any of the following three types of joining. That is, in a first example, the dielectric layer and the first electrode sheet are joined to each other through fusion-bonding of a part of the material of the dielectric layer. In a second example, the dielectric layer and the first electrode sheet are joined to each other through fusion-bonding of the first fusion-bonding material that is different from the material of the dielectric layer. In a third example, the dielectric layer and the first electrode sheet are joined to each other through mechanical engagement of the dielectric layer. In any of these examples, the dielectric layer and the first electrode sheet are joined to each other without using a volatilization-type adhesive or an organic solvent. Therefore, it is possible to reduce VOC discharge.

Further, the electrostatic sheet may be joined directly or indirectly to the conductive member. Here, "directly" means that the electrostatic sheet is in direct contact with the conductive member, and "indirectly" means that another member is interposed between the electrostatic sheet and the conductive member. Also, the dielectric layer and the conductive member are joined to each other through any one of the following two types of joining. That is, in a first example, the dielectric layer and the conductive member or a member attached to the conductive member are joined to each other through fusion-bonding of a part of the material of the dielectric layer. In a second example, the dielectric layer and the conductive member or a member attached to the conductive member are joined to each other through fusion-bonding of the second fusion-bonding material that is different from the material of the dielectric layer. In both examples, the dielectric layer and the conductive member or the member attached to the conductive member are joined to each other without using a volatilization-type adhesive and an organic solvent. Therefore, it is still possible to reduce VOC discharge at this portion.

In addition, since the electrostatic sheet is joined to the conductive member or the member attached to the conductive member as described above, it is possible to apply injection molding or the like for molding of an outer layer material. Therefore, manufacturing costs of the transducer are reduced as compared with a case in which sewing is performed.

(4. Fourth Transducer)

A fourth transducer includes: a conductive member; and an electrostatic sheet that is provided in a surface normal line direction of the conductive member. The electrostatic sheet includes a first electrode sheet provided with a plurality of through-holes, a dielectric layer with a first surface disposed on a side of the first electrode sheet and a second surface disposed on a side of the conductive member, and a second electrode sheet provided with a plurality of second through-holes and disposed on a side of the second surface of the dielectric layer. The dielectric layer on a side of the first surface is joined directly or indirectly to the first electrode sheet through any of fusion-bonding of a part of a material of the dielectric layer, fusion-bonding of a first fusion-bonding material that is different from the material of the dielectric layer, and mechanical engagement of the dielectric layer itself. Also, the dielectric layer on a side of the second surface is joined directly or indirectly to the second electrode sheet through any of fusion-bonding of a part of the material of the dielectric layer, fusion-bonding of a third fusion-bonding material that is different from the material of the dielectric layer, and mechanical engagement of the dielectric layer itself. Further, the dielectric layer on the side of the second surface is joined directly or indirectly to the conductive member through any of fusion-bonding of a part of the material of the dielectric layer and fusion-bonding of a second fusion-bonding material that is different from the material of the dielectric layer.

The electrostatic sheet includes the first electrode sheet, the dielectric layer, and the second electrode sheet, and the first electrode sheet, the dielectric layer, and the second electrode sheet are joined to each other. The first electrode sheet and the dielectric layer are joined to each other through any of the aforementioned three types of joining. The second electrode sheet and the dielectric layer are joined to each other through any of the following three types of joining. That is, in a first example, the dielectric layer and the second electrode sheet are joined to each other through fusion-bonding of a part of the material of the dielectric layer. In a second example, the dielectric layer and the second electrode sheet are joined to each other through fusion-bonding of the third fusion-bonding material that is different from the material of the dielectric layer. In a third example, the dielectric layer and the second electrode sheet are joined to each other through mechanical engagement of the dielectric layer. In any of these examples, the dielectric layer and the second electrode sheet are joined to each other without using a volatilization-type adhesive and an organic solvent. Therefore, it is possible to reduce VOC discharge in the manufacturing of the transducer.

(5. Method for Manufacturing Transducer)

A method for manufacturing the aforementioned first transducer includes: forming a laminated body by laminating materials of the first electrode sheet and the dielectric layer; and melting the fusion-bonding material by heating the laminated body on a side of a first outer surface of the first electrode sheet, thereby forming the first fusion-bonding layer that joins the body portion of the dielectric layer and the first electrode sheet.

A method for manufacturing the aforementioned second transducer includes: forming a laminated body by laminating the first electrode sheet and the material of the first dielectric layer that are integrally and mechanically engaged with each other, and the material of the second dielectric layer and the second electrode sheet that are integrally and mechanically engaged with each other; and melting the fusion-bonding material by heating the laminated body from a side of a first outer surface of the first electrode sheet or from a side of a second outer surface of the second electrode sheet, thereby forming the intermediate fusion-bonding layer that joins the first body portion of the first dielectric layer and the second body portion of the second dielectric layer.

According to the method for manufacturing the transducer, it is possible to manufacture the transducer without using a volatilization-type adhesive and an organic solvent since the fusion-bonding material is neither a volatilization-type adhesive nor an organic solvent. Therefore, it is possible to reduce VOC discharge in the manufacturing of the transducer.

Also, a method for manufacturing the third and fourth transducers includes: molding the electrostatic sheet; and joining the electrostatic sheet directly or indirectly to the conductive member. It is possible to reduce VOC discharge in this method for manufacturing the transducers.

DESCRIPTION OF EMBODIMENTS

1. Basic Configuration of Transducer T

A transducer T is of an electrostatic type. That is, the transducer T can be caused to function as an actuator that generates vibration, sound, and the like using a change in electrostatic capacitance between electrodes. Also, the transducer T can be caused to function as a sensor that detects a pressing force from the outside or the like (an external force detection sensor) or a sensor that detects contact or approach of a conductive body having a potential (contact or approach sensor) using a change in electrostatic capacitance between electrodes.

In a case in which the transducer T functions as an actuator, a dielectric body is deformed in accordance with a potential between electrodes by a voltage being applied to the electrodes, and vibration is thus generated with the deformation of the dielectric body. In a case in which the transducer T functions as an external force detection sensor, the dielectric body is deformed due to an input of a pressing force, vibration, sound, or the like from the outside, an electrostatic capacitance between the electrodes thus changes, and a voltage in accordance with the electrostatic capacitance between the electrodes is detected, thereby detecting the pressing force or the like from the outside. Also, in a case in which the transducer T functions as a contact or approach sensor, the electrostatic capacitance between the electrodes changes due to contact or approach of a conductive body having a potential, and a voltage in accordance with the changed electrostatic capacitance between the electrodes is detected, thereby detecting contact or approach of the conductive body.

As configurations of the transducer T, first to eighth examples will be described below. First, an outline of a basic configuration that is common to the transducers T in the respective example will be described. The outline of the configuration of the transducer T will be described with reference to FIG. 1.

Figure 1:
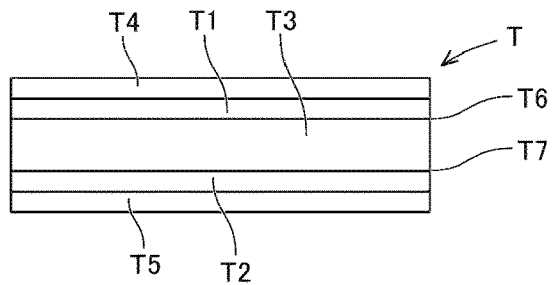
FIG. 1 is a diagram illustrating an outline of a configuration of a transducer.

As illustrated in FIG. 1, the transducer T is of an electrostatic type as described above. Therefore, as illustrated in FIG. 1, the transducer T includes a first electrode layer T1, a second electrode layer T2, and a dielectric layer T3 disposed between the first electrode layer T1 and the second electrode layer T2 (between a first inner surface of the first electrode layer T1 and a second inner surface of the second electrode layer T2). However, the transducer T may further include a first protective layer T4 that covers a first outer surface of the first electrode layer T1 and a second protective layer T5 that covers a second outer surface of the second electrode layer T2 depending on the type of the transducer.

Here, both the first electrode layer T1 and the second electrode layer T2 may be formed into deformable sheet shapes. In this case, a portion including the first electrode layer T1 and the second electrode layer T2 forms a deformable electrostatic sheet. Also, the first electrode layer T1 may be formed into a deformable sheet shape while the second electrode layer T2 may be a conductive member formed into an arbitrary non-deformable shape instead of a sheet shape. The non-deformable conductive member may be metal or the like with rigidity. In this case, a portion including the first electrode layer T1 other than the second electrode layer T2 forms the deformable electrostatic sheet.

In the following description, a case in which both the first electrode layer T1 and the second electrode layer T2 are formed into deformable sheet shapes will be exemplified. Also, a boundary region between the first electrode layer T1 and the dielectric layer T3 will be referred to as a first boundary region T6, and a boundary region between the second electrode layer T2 and the dielectric layer T3 will be referred to as a second boundary region T7.

2. Outline of Each Example

An outline of the configuration of the transducer T in each example is as shown in Tables 1 and 2. In any of the examples, some components are joined to each other through fusion-bonding of a fusion-bonding material in the transducer T. In addition, a portion, which is formed from the fusion-bonding material, at which joining target members are fusion-bonded, will be referred to as a fusion-bonding layer. Here, the fusion-bonding material is a material that is melted by heat and is then solidified, thereby exhibiting a force for joining to another member. However, the fusion-bonding material is a material that is different from a volatilization-type adhesive and can be melted by heat without using an organic solvent. That is, the fusion-bonding material is a thermoplastic material. In particular, a thermoplastic elastomer is preferably used as the fusion-bonding material in the following description.

As shown in Tables 1 and 2, the transducers T in the first to fourth examples each have a first fusion-bonding layer as the first boundary region T6, and the first electrode sheet that serves as the first electrode layer T1 and the dielectric layer T3 are joined to each other through fusion-bonding. The transducers T in the first and second examples each further have a second fusion-bonding layer that serves as the second boundary region T7, and the second electrode sheet that serves as the second electrode layer T2 and the dielectric layer T3 are joined to each other through fusion-bonding.

The transducers T in the fifth and sixth examples each have, for an internal configuration of the dielectric layer T3, an intermediate fusion-bonding layer which joins the first dielectric layer and the second dielectric layer through fusion-bonding. Also, the transducers T in the seventh and eighth examples each have, for internal configurations of the dielectric layer T3, a first intermediate fusion-bonding layer that joins the first dielectric layer and the intermediate dielectric layer through fusion-bonding and a second intermediate fusion-bonding layer that joins the second dielectric layer and the intermediate dielectric layer through fusion-bonding.

TABLE 1

|  | First example | Second example | Third example | Fourth example |
|---|---|---|---|---|
| First protective layer | First protective layer (part of dielectric material) | Not provided | Not provided | Not provided |
| First electrode layer | First electrode sheet (first through-holes are blocked) | First electrode sheet (first through-holes are open) | First electrode sheet (first through-holes are open) | First electrode sheet (first through-holes are open) |
| First boundary region | First fusion-bonding layer (part of dielectric material) | First fusion-bonding layer (dedicated material) | First fusion-bonding layer (part of dielectric material) | First fusion-bonding layer (dedicated material) |
| Dielectric layer | Dielectric layer (thermoplastic) | Dielectric layer (non-thermoplastic) | Dielectric layer (integrated with second electrode sheet) (thermoplastic) | Dielectric layer (integrated with second electrode sheet) (non-thermoplastic) |
| Second boundary region | Second fusion-bonding layer (part of dielectric material) | Second fusion-bonding layer (dedicated material) | Not provided | Not provided |
| Second electrode layer | Second electrode sheet (second through-holes are blocked) | Second electrode sheet (second through-holes are open) | Second electrode sheet (second through-holes are open) | Second electrode sheet (second through-holes are open) |
| Second protective layer | Second protective layer (part of dielectric material) | Not provided | Second protective layer (integrated with second electrode sheet) | Second protective layer (integrated with second electrode sheet) |

TABLE 2

|  | Fifth example | Sixth example | Seventh example | Eighth example |
|---|---|---|---|---|
| First protective layer | First protective layer (integrated with first electrode sheet) | First protective layer (integrated with first electrode sheet) | First protective layer (integrated with first electrode sheet) | First protective layer (integrated with first electrode sheet) |
| First electrode layer | First electrode sheet (first through-holes are open) | First electrode sheet (first through-holes are open) | First electrode sheet (first through-holes are open) | First electrode sheet (first through-holes are open) |
| First boundary region | Not provided | Not provided | Not provided | Not provided |
| Dielectric layer | First dielectric layer (integrated with first electrode sheet) (thermoplastic) Intermediate fusion-bonding layer (part of first dielectric layer or second dielectric layer) | First dielectric layer (integrated with first electrode sheet) (non-thermoplastic) Intermediate fusion-bonding layer (dedicated material) | First dielectric layer (integrated with first electrode sheet) (non-thermoplastic) First intermediate fusion-bonding layer (part of intermediate dielectric material) Intermediate dielectric layer (thermoplastic) Second intermediate fusion-bonding layer (part of intermediate dielectric material) | First dielectric layer (integrated with first electrode sheet) (non-thermoplastic) First intermediate fusion-bonding layer (dedicated material) Intermediate dielectric layer (non-thermoplastic) Second intermediate fusion-bonding layer (dedicated material) |

TABLE 2-continued

| | Fifth example | Sixth example | Seventh example | Eighth example |
|---|---|---|---|---|
| | Second dielectric layer (integrated with second electrode sheet) (thermoplastic) | Second dielectric layer (integrated with second electrode sheet) (non-thermoplastic) | Second dielectric layer (integrated with second electrode sheet) (non-thermoplastic) | Second dielectric layer (integrated with second electrode sheet) (non-thermoplastic) |
| Second boundary region | Not provided | Not provided | Not provided | Not provided |
| Second electrode layer | Second electrode sheet (second through-holes are open) | Second electrode sheet (second through-holes are open) | Second electrode sheet (second through-holes are open) | Second electrode sheet (second through-holes are open) |
| Second protective layer | Second protective layer (integrated with second electrode sheet) | Second protective layer (integrated with second electrode sheet) | Second protective layer (integrated with second electrode sheet) | Second protective layer (integrated with second electrode sheet) |

3. First Example

Figure 2:
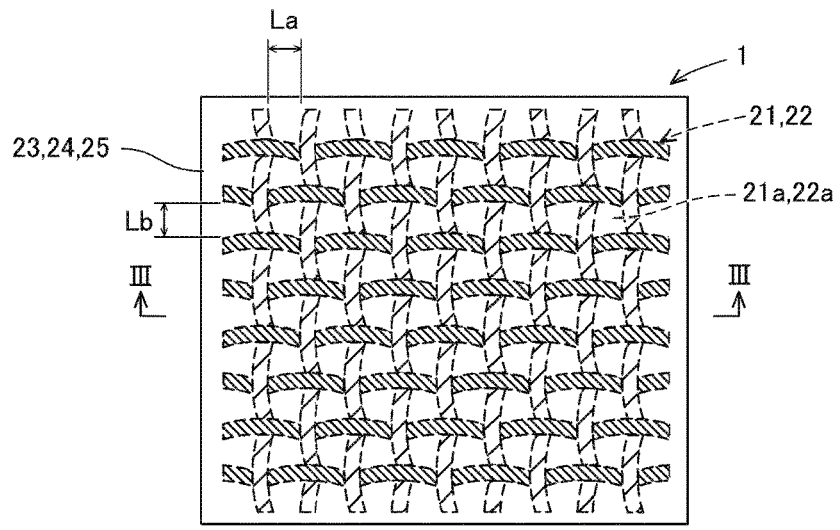
FIG. 2 is a plan view of a transducer in a first example.
Figure 3:
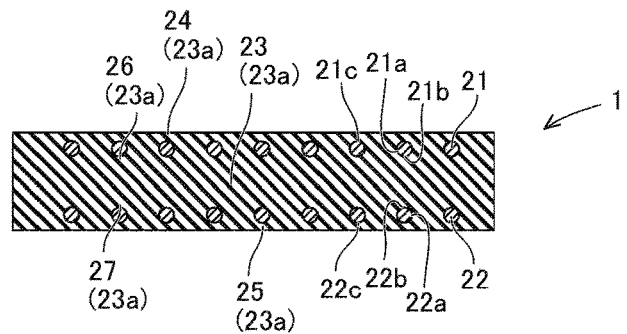
FIG. 3 is a sectional view taken along in FIG. 2.

A transducer 1 in the first example will be described with reference to FIGS. 2 to 4. As illustrated in FIGS. 2 and 3, the transducer 1 includes an electrostatic sheet including a first electrode sheet 21, a second electrode sheet 22, a dielectric layer 23, a first protective layer 24, and a second protective layer 25. Also, the transducer 1 in the first example can have a configuration in which the transducer 1 includes an electrostatic sheet that includes the first electrode sheet 21, the dielectric layer 23, and the first protective layer 24 without including the second electrode sheet 22 and the second protective layer 25, and also, the transducer 1 includes a non-deformable conductive member (not illustrated) corresponding to the second electrode layer T2 (illustrated in FIG. 1).

The first electrode sheet 21 and the second electrode sheet 22 are conductive cloths. The first electrode sheet 21 and the second electrode sheet 22 have conductivity, flexibility, and stretchability in a surface direction. The first electrode sheet 21 and the second electrode sheet 22 are woven or non-woven cloths formed from conductive fibers. Here, the conductive fibers are formed by covering a surface of flexible fibers with a conductive material. The conductive fibers may be formed by, for example, coating the surface of resin fibers made of polyethylene or the like with copper, nickel, or the like.

The first electrode sheet 21 includes a plurality of first through-holes 21a, has flexibility, and is stretchable and deformed in the surface direction by forming the cloth using the fibers. Similar to the first electrode sheet 21, the second electrode sheet 22 includes a plurality of second through-holes 22a.

Although a case in which the first electrode sheet 21 and the second electrode sheet 22 are conductive woven cloths will be exemplified below, it is also possible to apply conductive non-woven cloths thereto. The first electrode sheet 21 is formed by weaving the conductive fibers as warps and wefts as illustrated in FIG. 2, for example, in the case of the conductive woven-cloth. Regions surrounded by the warps and the wefts serve as the first through-holes 21a. The same applies to the second through-holes 22a.

Also, in a case in which the first electrode sheet 21 is a conductive non-woven cloth, the first through-holes 21a are irregularly formed. In addition, it is also possible to apply a punching metal thin film that has flexibility and is stretchable in the surface direction to the first electrode sheet 21 as well as a conductive cloth. In this case, the first through-holes 21a correspond to punched portions. Further, it is also possible to apply an elastomer sheet (including a rubber sheet) that contains a conductive material and includes a plurality of through-holes to the first electrode sheet 21. In addition, the elastomer in this example is a polymer material with elasticity, and this term is used having a meaning that includes a rubber-like elastic body and an elastic body in the form of a rubber other than a rubber-like elastic body.

The minimum opening length of the first through-holes 21a is set to be equal to or greater than 150 μm and equal to or less than 15 mm. The minimum opening length is a length of a minimum line segment in a line segment that connects two arbitrary points on an inner circumferential surface of each first through-hole 21a. As illustrated in FIG. 2, the minimum opening length is either an interval La between adjacent warps or an interval Lb between adjacent wefts in a case in which the first electrode sheet 21 is a conductive woven cloth (also illustrated in FIG. 14). That is, in the case in which the first electrode sheet 21 is a conductive woven cloth, the interval La or Lb of adjacent yarns is equal to or greater than 150 μm and equal to or less than 15 mm, for example. Here, the minimum opening length of the second through-holes 22a is similar to that of the first through-holes 21a. Further, an opening area of the first through-holes 21a is set to be equal to or greater than 6400 μm$^2$ and equal to or less than 225 mm$^2$. The opening area of the second through-holes 22a is also similar to that of the first through-holes 21a.

The first through-holes 21a are open (stretched) and are easily covered when covered by a surface of an object with a three-dimensional shape by setting the minimum opening length of the first through-holes 21a to be equal to or greater than 150 μm as described above. Also, a similar effect is also achieved by setting the minimum value of the opening area of the first through-holes 21a to be equal to or greater than 6400 μm$^2$. In regard to these points, the same to the first through-holes 21a applies to the second through-holes 22a.

In addition, the maximum value, 15 mm of the minimum opening length of the first through-holes 21a corresponds to a width with which a human finger can be brought into contact with the first through-holes 21a. This enables the transducer 1 to be reliably used as a sensor for detecting contact of a human finger. Also, it is possible to reliably use the transducer 1 as a sensor for detecting contact of a human finger by setting the maximum value of the opening area of the first through-holes 21a to be equal to or less than 225 mm$^2$. In regard to these points, the same as to the first through-holes 21a applies to the second through-holes 22a.

The first electrode sheet 21 and the second electrode sheet 22 are formed to have substantially the same sizes and are disposed to face each other. Here, a surface of the first electrode sheet 21 that faces the second electrode sheet 22 is assumed to be a first inner surface 21b, and a surface on a side opposite to the second electrode sheet 22 is assumed to be a first outer surface 21c. In addition, a surface of the second electrode sheet 22 that faces the first electrode sheet 21 is assumed to be a second inner surface 22b, and a surface on a side opposite to the first electrode sheet 21 is assumed to be a second outer surface 22c.

The dielectric layer 23 is formed from an elastically deformable dielectric material. Specifically, the dielectric layer 23 is formed from a thermoplastic elastomer. The dielectric layer 23 has a sheet shape and is formed to have an outer shape that is similar to the outer shape of the first electrode sheet 21. The dielectric layer 23 has a structure in which the dielectric layer 23 is stretched in a thickness direction and is also stretched in the surface direction. The first electrode sheet 21 is disposed on the side of the first surface (the upper surface in FIG. 3) of the dielectric layer 23, and the second electrode sheet 22 is disposed on the side of the second surface (the lower surface in FIG. 3; on the rear surface side of the first surface) of the dielectric layer 23. A body portion (main portion) of the dielectric layer 23 is disposed between the first inner surface 21b of the first electrode sheet 21 and the second inner surface 22b of the second electrode sheet 22.

However, the first electrode sheet 21 is buried in a material 23a of the dielectric layer 23 (referred to as a dielectric material; illustrated in FIG. 4) on the side of the first surface (on the upper side in FIG. 3). That is, a part of the dielectric material 23a on the side of the first surface is present as the first dielectric layer 26 in the first inner circumferential surfaces of the plurality of first through-holes 21a and the first inner surface 21b of the first electrode sheet 21. The first fusion-bonding layer 26 applies the fusion-bonding material to a part of the dielectric material 23a and joins, through fusion-bonding of the part of the dielectric material 23a, a boundary region between the first inner circumferential surfaces of the first through-holes 21a and the body portion of the dielectric layer 23 and a boundary region between the first inner surface 21b and the body portion of the dielectric layer 23. Here, the body portion of the dielectric layer 23 means a portion interposed between the first electrode sheet 21 and the second electrode sheet 22.

More specifically, the first fusion-bonding layer 26 is fusion-bonded to the entire first inner surface 21b. That is, the first fusion-bonding layer 26 is fusion-bonded over the entire range in which the body portion of the dielectric layer 23 and the first inner surface 21b face each other. Further, since the first through-holes 21a are completely filled with the first fusion-bonding layer 26, the first fusion-bonding layer 26 blocks the first through-holes 21a. That is, the first fusion-bonding layer 26 is fusion-bonded to the entire first inner circumferential surfaces of the first through-holes 21a. Therefore, a joining force between the first electrode sheet 21 and the dielectric layer 23 is significantly strong.

Further, a part of the dielectric material 23a (illustrated in FIG. 4) on the side of the first surface is present as the first protective layer 24 on the first outer surface 21c of the first electrode sheet 21. Since the first electrode sheet 21 is not exposed due to the presence of the first protective layer 24, satisfactory handling properties of the transducer 1 are achieved. Further, since a part of the dielectric material 23a is present so as to surround the entire circumference of the yarns of the first electrode sheet 21, the joining force between the first electrode sheet 21 and the dielectric layer 23 is significantly strong.

Similar to the first electrode sheet 21, the second electrode sheet 22 is buried in the dielectric material 23a on the side of the second surface (the lower side in FIG. 3). That is, a part of the dielectric layer 23a on the side of the second surface is present as the second fusion-bonding layer 27 in the second inner circumferential surfaces of the plurality of second through-holes 22a and the second inner surface 22b of the second electrode sheet 22. The second fusion-bonding layer 27 applies the fusion-bonding material to a part of the dielectric material 23a and joins, through fusion-bonding of the part of the dielectric material 23a, a boundary region between the second inner circumferential surfaces of the second through-holes 22a and the body portion of the dielectric layer 23 and a boundary region between the second inner surface 22b and the body portion of the dielectric layer 23.

More specifically, the second fusion-bonding layer 27 is fusion-bonded to the entire second inner surface 22b. That is, the second fusion-bonding layer 27 is fusion-bonded over the entire range in which the body portion of the dielectric layer 23 and the second inner surface 22b face each other. Further, since the second through-holes 22a are completely filled with the second dielectric layer 27, the second fusion-bonding layer 27 blocks the second through-holes 22a. That is, the second fusion-bonding layer 27 is fusion-bonded to the entire second inner circumferential surfaces of the second through-holes 22a. Therefore, a joining force between the second electrode sheet 22 and the dielectric layer 23 is significantly strong.

Further, a part of the dielectric material 23a on the side of the second surface is present as the second protective layer 25 on the second outer surface 22c of the second electrode sheet 22. Since the second electrode sheet 22 is not exposed due to the presence of the second protective layer 25, satisfactory handling properties of the transducer 1 are achieved. Further, since a part of the dielectric material 23a is present so as to surround the entire circumference of the yarns of the second electrode sheet 22, the joining force between the second electrode sheet 22 and the dielectric layer 23 is significantly strong.

Also, the first fusion-bonding layer 26 and the second fusion-bonding layer 27 are formed from the same material constituent as that of the dielectric layer 23. That is, the first fusion-bonding layer 26 and the second fusion-bonding layer 27 are formed by applying heat to a part of the dielectric material 23a formed from a thermoplastic elastomer. That is, the first fusion-bonding layer 26 and the second fusion-bonding layer 27 are formed substantially without any change in material constituent of the dielectric material 23a. This means that the first fusion-bonding layer 26 and the second fusion-bonding layer 27 do not contain a volatilization-type adhesive, an organic solvent, and the like.

Next, a method for manufacturing the transducer 1 will be described with reference to FIG. 4. The manufacturing of the transducer 1 involves a pair of rollers 41 and 42 for pressurization heating (pressurization heating members). The transducer 1 as a product is manufactured by heating a material 1a while pressurizing the material 1a with the pair of rollers 41 and 42 when the material 1a is transported. Also, pressurization and heating can also be performed using a pair of press plates (not illustrated) instead of the pair of rollers 41 and 42. In a case in which the transducer 1 does not include the second electrode sheet 22, the lower roller 42 in FIG. 4 may perform only pressurization, and it is not necessary for the roller 42 to perform heating.

Figure 4:
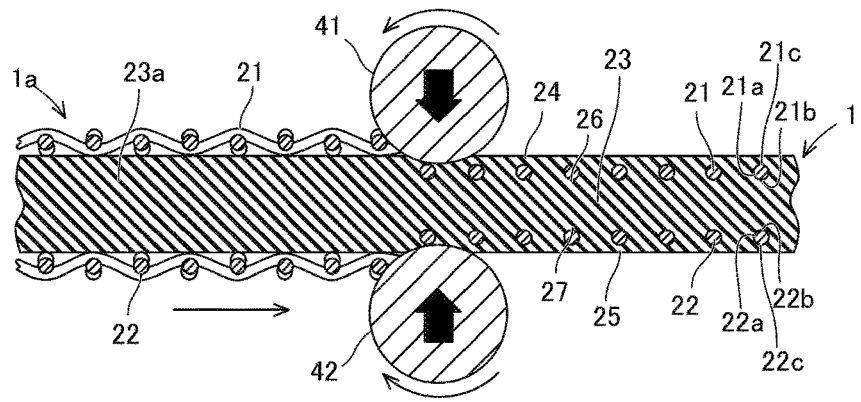
FIG. 4 is a diagram illustrating a method for manufacturing a transducer in a first example.

As illustrated on the left side in FIG. 4, (a) the first electrode sheet 21, (b) the second electrode sheet 22, and (c) the dielectric material 23a are prepared for the material 1a of the transducer 1. A laminated body is formed by laminating (a) the first electrode sheet 21, (c) the dielectric material 23a, and (b) the second electrode sheet 22 in this order. The laminated material 1a (laminated body) is transported to the right side in FIG. 4 and is then caused to enter between the pair of rollers 41 and 42.

That is, the pair of rollers 41 and 42 performs pressurization and heating on the side of the first outer surface 21c of the first electrode sheet 21 and performs pressurization and heating on the side of the second outer surface 22c of the second electrode sheet 22. In this manner, the heat from the first roller 41 is delivered to the first surface (the upper side in FIG. 4) of the dielectric material 23a, and the portion to which the heat is delivered is melted. Similar to the first roller 41, the heat from the second roller 42 is delivered to the second surface (the lower side in FIG. 4) of the dielectric material 23a, and the portion to which the heat is delivered is melted.

Then, the first electrode sheet 21 is buried on the side of the first surface of the dielectric material 23a, and the second electrode sheet 22 is buried on the side of the second surface of the dielectric material 23a. Also, a part of the dielectric material 23a on the side of the first surface is fusion-bonded to the first electrode sheet 21 and the second electrode sheet 22 with solidification of the melted dielectric material 23a.

In this manner, a part of the dielectric material 23a on the side of the first surface forms the first fusion-bonding layer 26 and joins the boundary region between the first inner circumferential surfaces of the first through-holes 21a of the first electrode sheet 21 and the dielectric layer 23 and the boundary region between the first inner surface 21b and the dielectric layer 23. Further, a part of the dielectric material 23a on the side of the first surface forms the first protective layer 24 that covers the first outer surface 21c of the first electrode sheet 21. Similar to the side of the first surface of the dielectric material 23a, a part of the dielectric material 23a on the side of the second surface forms the second dielectric layer 27 and joins the boundary region between the first inner circumferential surfaces of the second through-holes 22a of the second electrode sheet 22 and the dielectric layer 23 and the boundary region between the second inner surface 22b and the dielectric layer 23. Further, a part of the dielectric material 23a on the side of the second surface forms the second protective layer 25 that covers the second outer surface 22c of the second electrode sheet 22.

According to the transducer 1 in the first example, the body portion of the dielectric layer 23 and the first electrode sheet 21 are joined to each other through the fusion-bonding of the fusion-bonding material. Since the fusion-bonding material is neither an adhesive nor an organic solvent, the transducer 1 can be manufactured without using an adhesive and an organic solvent. Therefore, it is possible to reduce manufacturing costs and to reduce VOC discharge in the manufacturing of the transducer 1.

Here, the first electrode 21 and the second electrode 22 have flexibility and stretchability in the surface direction in the transducer 1. Further, the dielectric layer 23, the first fusion-bonding layer 26, the second fusion-bonding layer 27, the first protective layer 24, and the second protective layer 25 are formed from elastomers. Therefore, the entire transducer 1 has flexibility and stretchability in the surface direction and the normal line direction. For this reason, it is possible to neatly attach the transducer 1 to an attachment target with an arbitrary shape.

Further, the first fusion-bonding layer 26 and the second fusion-bonding layer 27 are formed from the same material constituent as that of the dielectric layer 23 by the first fusion-bonding layer 26 and the second fusion-bonding layer 27 being formed from a part of the dielectric material 23a. Therefore, the first fusion-bonding layer 26 and the second fusion-bonding layer 27 do not prevent the dielectric layer 23 from being deformed.

4. Second Example

A transducer 2 and a method for manufacturing the transducer 2 in the second example will be described with reference to FIG. 5. The same reference numerals will be used to denote components the same as those in the first example, and detailed description thereof will be omitted.

Figure 5:
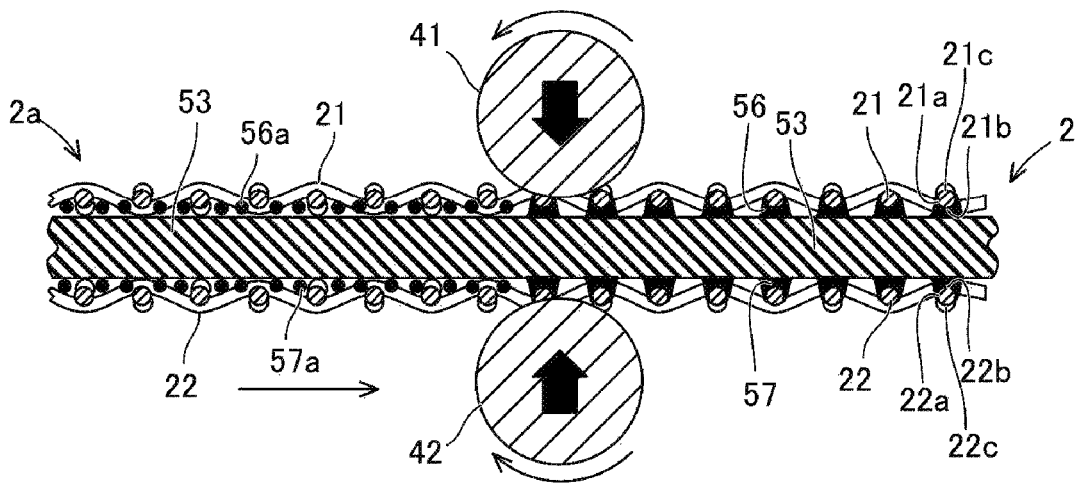
FIG. 5 is a diagram illustrating a method for manufacturing a transducer in a second example.

As illustrated on the left side in FIG. 5, (a) the first electrode sheet 21, (b) the second electrode sheet 22, (c) a dielectric layer 53, (d) a first fusion-bonding material 56a, and (e) a second fusion-bonding material 57a are prepared for a material 2a of the transducer 2. The dielectric layer 53 is formed from a non-thermoplastic material. In particular, the dielectric layer 53 is formed from a non-thermoplastic material elastomer in this example. Further, a foaming material of the non-thermoplastic material elastomer is used for the dielectric layer 53. That is, the dielectric layer 53 has holes that establish communication in the normal line direction of the sheet, that is, in the lamination direction of the laminated body of the components of the transducer 2.

That is, the dielectric layer 53 does not melt even if the heat from the pair of rollers 41 and 42 is delivered thereto. Also, a material with satisfactory breathability such as a non-thermoplastic material non-woven cloth can also be applied to the dielectric layer 53 as well as an elastomer.

The first fusion-bonding material 56a and the second fusion-bonding material 57a are formed from thermoplastic material elastomers. That is, the first fusion-bonding material 56a and the second fusion-bonding material 57a are formed from materials that are different from that of the dielectric layer 53. However, a modulus of elasticity in a state in which the first fusion-bonding material 56a and the second fusion-bonding material 57a are solidified is preferably substantially the same as that of the dielectric layer 53. The first fusion-bonding material 56a and the second fusion-bonding material 57a are formed in the form of particles, for example, and melt if heat is applied thereto.

In addition, a laminated body made of the material 2a is formed by laminating (a) the first electrode sheet 21, (d) the first fusion-bonding material 56a, (c) the dielectric layer 53, (e) the second fusion-bonding material 57a, and (b) the second electrode sheet 22 in this order.

However, although this example will be described on the assumption of a state in which both surfaces of the transducer 2 are manufactured at the same time, each surface may be manufactured one at a time. In this case, (a) the first electrode sheet 21, (d) the first fusion-bonding material 56a, and (c) the dielectric layer 53 are laminated in this order to manufacture one surface, and (0 the manufactured article corresponding to the one surface, (e) the second fusion-bonding material 57a, and (b) the second electrode sheet 22 are then laminated in this order to manufacture the other surface.

Returning to FIG. 5, description will be continued. The laminated material 2a (laminated body) is transferred to the right side in FIG. 5 and is caused to enter between the pair of rollers 41 and 42. That is, the first roller 41 performs pressurization and heating from the side of the first outer surface 21c of the first electrode sheet 21. In this manner, the heat from the first roller 41 is delivered to the first fusion-bonding material 56a, and the first fusion-bonding material 56a is melted. Thus, the melted first fusion-bonding material 56a forms the first fusion-bonding layer 56 that joins the boundary region between the first inner surfaces of at least some of the first through-holes 21a of the first electrode sheet 21 and the dielectric layer 53.

The first fusion-bonding layer 56 further joins the boundary region between at least a part of the first inner surface 21b of the first electrode sheet 21 and the dielectric layer 53. The first fusion-bonding layer 56 may be fusion-bonded over the entire range in which the dielectric layer 53 and the first inner surface 21b face each other. In this case, a strong joining force is achieved. Meanwhile, the first fusion-bonding layer 56 may be fusion-bonded such that a gap is provided at a part in the surface direction in the facing range. In this case, a state in which the conductive joining material is joined over a wide range on the first electrode sheet 21 can be formed in a case in which the first electrode sheet 21 and a lead line are joined with a conductive joining material such as a solder or a conductive resin, for example.

Here, the first outer surface 21c of the first electrode sheet 21 is exposed since the first fusion-bonding material 56a is not present. However, it is also possible to form the first protective layer that covers the first outer surface 21c by adjusting the amount of the first fusion-bonding material 56a.

The second roller 42 performs pressurization and heating from the side of the second outer surface 22c of the second electrode sheet 22 similar to the first roller 41. In this manner, the heat from the second roller 42 is delivered to the second fusion-bonding material 57a, and the second fusion-bonding material 57a is melted. Thus, the melted second fusion-bonding material 57a forms the second fusion-bonding layer 57 that joins the boundary region between the second inner circumferential surfaces of at least some of the second through-holes 22a of the second electrode sheet 22 and the dielectric layer 53 and the boundary region between at least a part of the second inner surface 22b of the second electrode sheet 22 and the dielectric layer 53. Here, the second outer surface 22c of the second electrode sheet 22 is exposed since the second fusion-bonding material 57a is not present. However, it is also possible to form the second protective layer that covers the second outer surface 22c by adjusting the amount of the second fusion-bonding material 57a.

The transducer 2 manufactured as described above includes the first electrode sheet 21, the second electrode sheet 22, the dielectric layer 53, the first fusion-bonding layer 56 that is formed from a material different from that of the dielectric layer 53, and the second fusion-bonding layer 57 that is formed from a material different from that of the dielectric layer 53. Similar to the first example, it is also possible to reduce VOC discharge by the manufacturing method. Also, similar effects are achieved in regard to other effects.

Further, since the dielectric layer 53 is formed from a foaming material, a non-woven cloth, or the like, the dielectric layer 53 has holes that establish communication in the normal line direction (lamination direction) of the transducer 2. Also, the first fusion-bonding layer 56 is fusion-bonded to the first inner circumference surfaces while maintaining a state in which the first through-holes 21a of the first electrode sheet 21 penetrate through the first electrode sheet 21. Further, the first fusion-bonding layer 56 is fusion-bonded to a part of the first inner surface 21b of the first electrode sheet 21 and forms a gap between another part and the dielectric layer 53. Also, the second fusion-bonding layer 57 is fusion-bonded to a part of the second inner surface 22b of the second electrode sheet 22 and forms a gap between another part and the dielectric layer 53.

Therefore, both surfaces of the electrostatic sheet that forms the transducer 2 communicate with each other through the plurality of first through-holes 21a, the plurality of second through-holes 22a, and the holes in the dielectric layer 53 in the transducer 2. That is, the first surface and the second surface of the electrostatic sheet communicate with each other. In this manner, since the entire electrostatic sheet that forms the transducer 2 has breathability, the electrostatic sheet that forms the transducer 2 can be placed at a location at which breathability is required. Also, a thermoplastic material or a non-thermoplastic material may be used for the dielectric layer in a case in which the transducer 2 is placed at a location at which no breathability is required.

5. Third Example

A transducer 3 and a method for manufacturing the transducer 3 in the third example will be described with reference to FIG. 6. The same reference numerals will be used to denote components the same as those in the first example, and detailed description thereof will be omitted.

Figure 6:
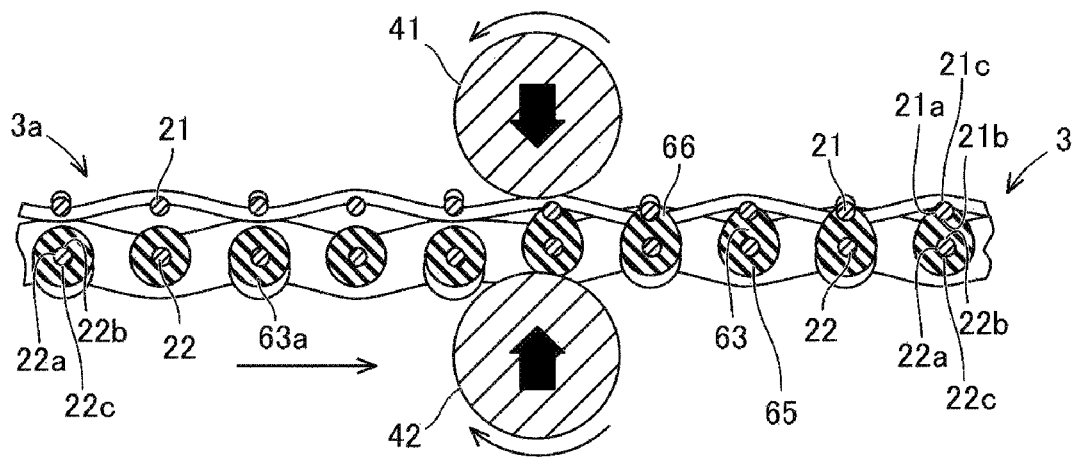
FIG. 6 is a diagram illustrating a method for manufacturing a transducer in a third example.

As illustrated on the left side in FIG. 6, (a) the first electrode sheet 21 and (b) a member in which the second electrode sheet 22 and a dielectric material 63a are integrated are prepared as a material 3a of the transducer 3. Here, the dielectric material 63a is formed from a thermoplastic elastomer similar to the dielectric material 23a in the first example.

The dielectric material 63a is integrally and mechanically engaged by being caused to the entire surface of the conductive fiber of the second electrode sheet 22 through dipping, spraying, coating, or the like. Therefore, the dielectric material 63a is caused to adhere to all the second inner circumferential surfaces of the second through-holes 22a, the second inner surface 22b, and the second outer surface 22c of the second electrode sheet. Here, the dielectric material 63a is integrally and mechanically engaged with the second electrode sheet 22 in a state in which the dielectric material 63a is caused to adhere thereto while a state in which the second through-holes 22a penetrate through the second electrode sheet 22. Also, it is possible to state that the dielectric material 63a has holes in a direction similar to that of the second through-holes 22a in the second electrode sheet 22 (the surface normal line direction and the lamination direction). That is, the member in which the dielectric material 63a adheres to the surface of the second electrode sheet 22 maintains the shape of the woven cloth.

Next, a laminated body formed from the material 3a is formed by laminating (a) the first electrode sheet 21 and (b) the member in which the second electrode sheet 22 and the dielectric material 63a are integrated in this order as illustrated on the left side in FIG. 6. The laminated material 3a (laminated body) is transported to the right side in FIG. 6 and is caused to enter between the first rollers 41 and 42. That is, the pair of rollers 41 and 42 perform pressurization and heating on the side of the first outer surface 21c of the first electrode sheet 21 and perform pressurization and heating on the side of the second outer surface 22c of the second electrode sheet 22. In this manner, the heat from the first roller 41 is mainly delivered to the surface of the dielectric material 63a on the side of the first electrode sheet 21 (the upper side in FIG. 6), and the portion to which the heat is delivered is melted.

Thus, a part of the first electrode sheet 21 enters the dielectric material 63a. Then, a part of the dielectric material 63a is fusion-bonded to the first electrode sheet 21 with solidification of the melted dielectric material 63a. In this manner, the first fusion-bonding layer 66 in which the part of the dielectric material 63a is applied as the fusion-bonding material is formed. That is, the first fusion-bonding layer 66 is formed from the same material constituent as that of the body portion of the dielectric layer 63. The first fusion-bonding layer 66 joins the boundary region between at least some of the first inner circumferential surfaces of the first through-holes 21a of the first electrode sheet 21 and the body portion of the dielectric layer 63 and the boundary region between the first inner surface 21b and the body portion of the dielectric layer 63. At this time, the part of the dielectric material 63a that forms the first fusion-bonding layer 66 is fusion bonded to the first inner circumferential surfaces of the first through-holes 21a while a state in which the first through-holes 21a penetrate through the first electrode sheet 21 is maintained.

Also, the dielectric material 63a forms the second protective layer 65 that covers the second outer surface 22c of the second electrode sheet 22 in advance. In addition, the second roller 42 may not perform heating.

The transducer 3 manufactured as described above includes the first electrode sheet 21, the second electrode sheet 22, the dielectric layer 63, and the first fusion-bonding layer 66 formed by a part of the dielectric material 63a, and the second protective layer 65 formed by the dielectric material 63a. It is also possible to reduce manufacturing costs and to reduce VOC discharge similar to the first example by the manufacturing method. In addition, similar effects are also achieved in regard to other effects.

Further, the dielectric material 63a maintains a state in which the second through-holes 22a of the second electrode sheet 22 penetrate through the second electrode sheet 22. Also, the first fusion-bonding layer 66 is fusion-bonded to the first inner circumferential surfaces while maintaining the state in which the first through-holes 21a of the first electrode sheet 21 penetrate through the first electrode sheet 21. Therefore, both surfaces of the electrostatic sheet that forms the transducer 3 communicate with each other through the plurality of first through-holes 21a and the plurality of second through-holes 22a in the transducer 3. In this manner, since the entire electrostatic sheet that forms the transducer 3 has breathability, it is possible to place the electrostatic sheet that forms the transducer 3 at a location at which breathability is required.

6. Modification Configuration of Third Example

In the third example, the dielectric material 63a is caused to adhere to the second electrode sheet 22 through dipping, spraying, coating, or the like. In addition to these methods, known co-extrusion can also be applied in order to manufacture the member in which the second electrode sheet 22 and the dielectric material 63a are integrated. However, since the dielectric material 63a blocks the second through-holes 22a of the second electrode sheet 22, the transducer 3 does not have breathability in this case.

7. Fourth Example

A transducer 4 and a method for manufacturing the transducer 4 in the fourth example will be described with reference to FIG. 7. The same reference numerals will be used to denote components the same as those in the first example, and detailed description thereof will be omitted.

Figure 7:
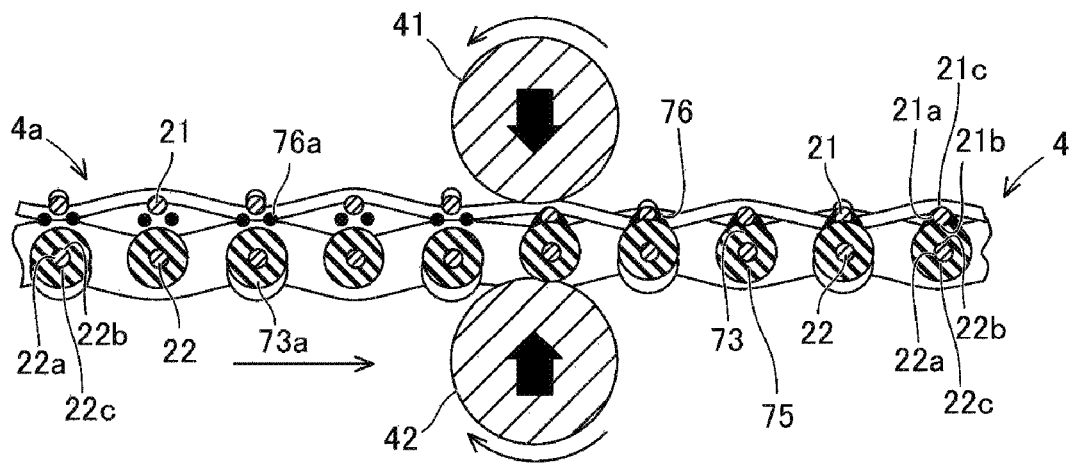
FIG. 7 is a diagram illustrating a method for manufacturing a transducer in a fourth example.

As illustrated on the left side in FIG. 7, (a) the first electrode sheet 21, (b) a member in which the second electrode sheet 22 and a dielectric material 73a are integrated, and (c) a first fusion-bonding material 76a are prepared as a material 4a of the transducer 4. The dielectric material 73a is formed from a non-thermoplastic material elastomer. That is, the dielectric material 73a does not melt even if heat is delivered from the pair of rollers 41 and 42.

The dielectric material 73a is integrally and mechanically engaged with the second electrode sheet 22 by being caused to adhere to the entire surface of the conducive fiber of the second electrode sheet 22 through dipping, spraying, coating, or the like similar to the third example. Here, the dielectric material 73a is integrally and mechanically engaged with the second electrode sheet 22 in a state in which the dielectric material 73a adheres while maintaining a state in which the second through-holes 22a penetrate through the second electrode sheet 22. In addition, it is possible to state that the dielectric material 73a has holes in a direction similar to that of the second through-holes 22a of the second electrode sheet 22 (the surface normal line direction and the lamination direction).

The first fusion-bonding material 76a is formed from a thermoplastic material elastomer. That is, the first fusion-bonding material 76a is a material that is different from that of the dielectric material 73a. However, a modulus of elasticity in a state in which the first fusion-bonding material 76a is solidified may be substantially the same as that of the dielectric material 73a. The first fusion-bonding material 76a is formed into the form of particles and is melt when heat is applied thereto.

Then, a laminated body formed from a material 4a is formed by laminating (a) the first electrode sheet 21, (c) the first fusion-bonding material 76a, and (b) the member in which the second electrode sheet 22 and the dielectric material 73a are integrated in this order. The laminated material 4a (laminated body) is transported to the right side in FIG. 7 and is caused to enter between the pair of rollers 41 and 42. That is, the pair of rollers 41 and 42 perform pressurization and heating on the side of the first outer surface 21c of the first electrode sheet 21 and performs pressurization and heating on the side of second outer surface 22c of the second electrode sheet 22. In this manner, the heat from the first roller 41 is mainly delivered to the first fusion-bonding material 76a, and the first fusion-bonding material 76a is melted.

Thus, the melted first fusion-bonding material 76a forms the first fusion-bonding layer 76 that joins the boundary region between the first inner circumferential surfaces of at least some of the first through-holes 21a of the first electrode sheet 21 and the dielectric layer 73 and the boundary region between at least a part of the first inner surface 21b of the first electrode sheet 21 and the dielectric layer 73. Here, the first outer surface 21c of the first electrode sheet 21 is exposed since the first fusion-bonding material 76a is not present. However, it is also possible to form the first protective layer that covers the first outer surface 21c by adjusting the amount of the first fusion-bonding material 76a.

In addition, the dielectric material 73a forms the second protective layer 75 that covers the second outer surface 22c of the second electrode sheet 22 in advance. Also, the second roller 42 may not perform heating.

The transducer 4 manufactured as described above includes the first electrode sheet 21, the second electrode sheet 22, the dielectric layer 73, the first fusion-bonding layer 76 formed from a material that is different from that of the dielectric layer 73, and the second protective layer 75 that is formed from the dielectric material 73a. It is also possible to suppress VOC discharge similar to the first example by the manufacturing method. Further, since the entire electrostatic sheet that forms the transducer 4 has breathability, it is possible to place the electrostatic sheet that forms the transducer 4 at a location at which breathability is required similar to the third example.

8. Fifth Example

A transducer 5 and a method for manufacturing the transducer 5 in the fifth example will be described with reference to FIG. 8. The same reference numerals as the first example will be used to denote components the same as those in FIG. 1, and detailed description thereof will be omitted.

Figure 8:
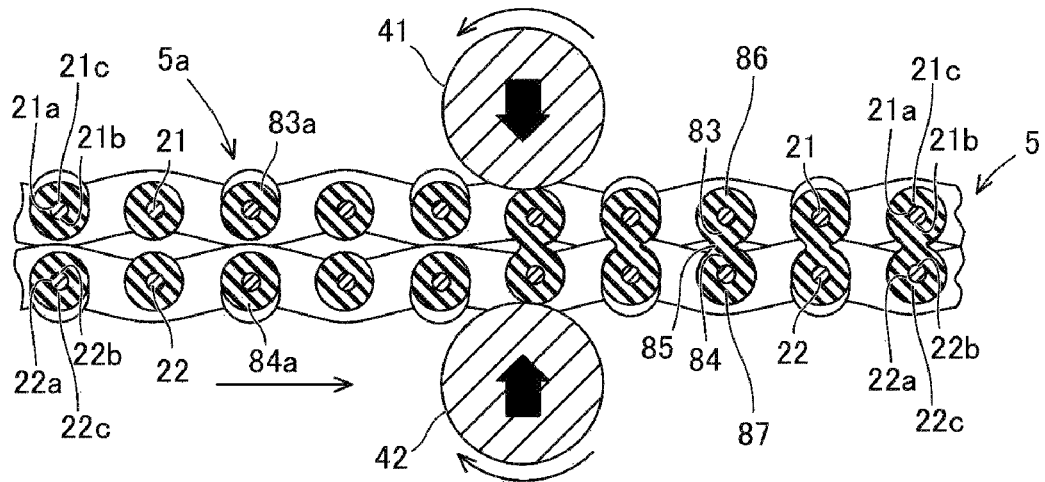
FIG. 8 is a diagram illustrating a method for manufacturing a transducer in a fifth example.

As illustrated on the left side in FIG. 8, (a) a member in which the first electrode sheet 21 and a first dielectric material 83*a* are integrated and (b) a member in which the second electrode sheet 22 and a second dielectric material 84*a* are integrated are prepared as a material 5*a* of the transducer 5. Here, the first dielectric material 83*a* and the second dielectric material 84*a* are formed from thermoplastic elastomers similar to the dielectric material 23*a* in the first example. Also, the first dielectric material 83*a* and the second dielectric material 84*a* are integrated with the first electrode sheet 21 and the second electrode sheet 22 by the method similar to that in the third example.

Next, (a) the member in which the first electrode sheet 21 and the first dielectric material 83*a* are integrated and (b) the member in which the second electrode sheet 22 and the second dielectric material 84*a* are integrated are laminated in this order as illustrated on the left side in FIG. 8. The laminated material 5*a* (laminated body) is transported to the right side in FIG. 8 and is caused to enter between the pair of rollers 41 and 42. That is, the pair of rollers 41 and 42 perform pressurization and heating on the side of the first outer surface 21*c* of the first electrode sheet 21 and perform pressurization and heating on the side of the second outer surface 22*c* of the second electrode sheet 22. In this manner, the heat from the pair of rollers 41 and 42 is delivered to a portion of the first dielectric material 83*a* on the side of the second dielectric material 84*a* and a portion of the second dielectric material 84*a* on the side of the first dielectric material 83*a*, and the portions to which the heat is delivered is melted.

Thus, a part of the first dielectric material 83*a* and a part of the second dielectric material 84*a* are fusion-bonded to each other. In this manner, the intermediate fusion-bonding layer 85 in which the part of the first dielectric material 83*a* and the part of the second dielectric material 84*a* are applied as a fusion-bonding material is formed. That is, the intermediate fusion-bonding layer 85 is formed from the same material constituent as those of the first dielectric layer 83 and the second dielectric layer 84. The first dielectric layer 83 and the second dielectric layer 84 are joined directly to the intermediate fusion-bonding layer 85.

In addition, the first dielectric material 83*a* forms the first protective layer 86 that covers the first outer surface 21*c* of the first electrode sheet 21 in advance. Also, the second dielectric material 84*a* forms the second protective layer 87 that covers the second outer surface 22*c* of the second electrode sheet 22 in advance.

The transducer 5 manufactured as described above includes the first electrode sheet 21, the second electrode sheet 22, the first dielectric layer 83, the second dielectric layer 84, the intermediate fusion-bonding layer 85, the first protective layer 86, and the second protective layer 87. It is also possible to reduce manufacturing costs and to reduce VOC discharge similar to the first example by the manufacturing method. Further, since the entire transducer 5 has breathability, it is possible to place the transducer 5 at a location at which breathability is required.

9. Modification Configuration of Fifth Example

Figure 9:
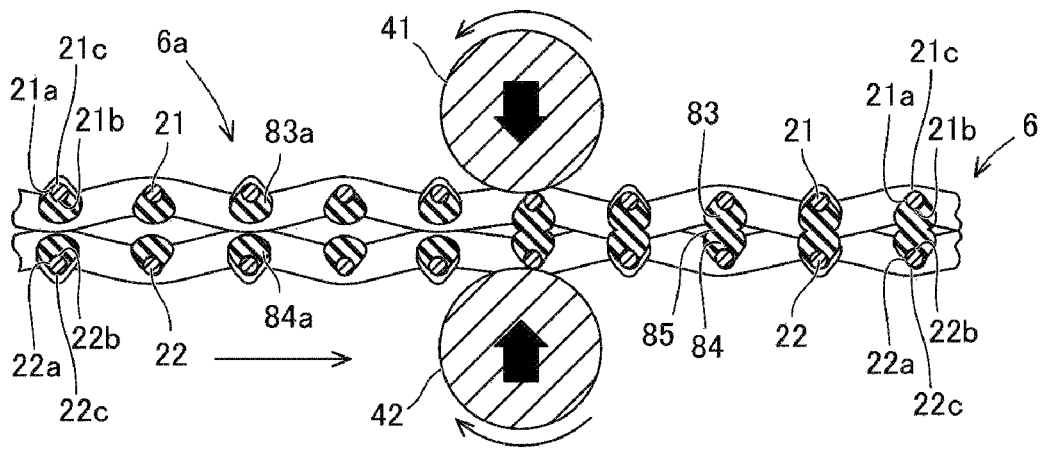
FIG. 9 is a diagram illustrating a method for manufacturing a transducer in a modification configuration of the fifth example.

A transducer 6 and a method for manufacturing the transducer 6 in a modification configuration of the fifth example will be described with reference to FIG. 9. Differences from the fifth example will be described. As illustrated in FIG. 9, the first dielectric material 83*a* does not cover the first outer surface 21*c* of the first electrode sheet 21. Further, the second dielectric material 84*a* does not cover the second outer surface 22*c* of the second electrode sheet 22. Also, a material 6*a* of the transducer 6 is prepared, and the transducer 6 is manufactured similar to the fifth example. The transducer 6 manufactured in this manner is substantially common to the transducer 5 in the fifth example. However, the first outer surface 21*c* of the first electrode sheet 21 and the second outer surface 22*c* of the second electrode sheet 22 are exposed. The transducer 6 sufficiently exhibits effects as long as it is possible to allow the exposure of the electrodes.

10. Sixth Example

A transducer 7 and a method for manufacturing the transducer 7 in the sixth example will be described with reference to FIG. 10. The same reference numerals will be used to denote components the same as those in the first example, and detailed description thereof will be omitted.

Figure 10:
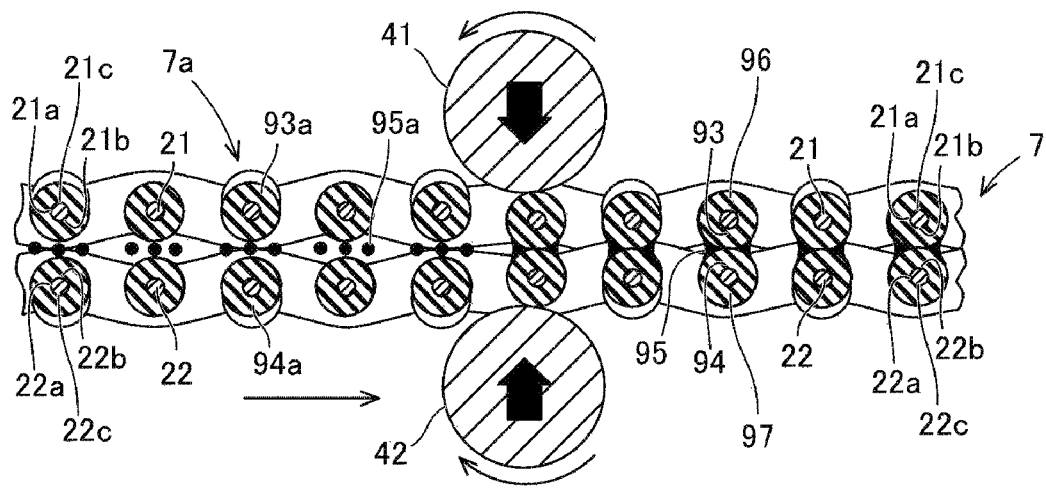
FIG. 10 is a diagram illustrating a method for manufacturing a transducer in a sixth example.

As illustrated on the left side in FIG. 10, (a) a member in which the first electrode sheet 21 and a first dielectric material 93*a* are integrated, (b) a member in which the second electrode sheet 22 and a second dielectric material 94*a* are integrated, and (c) an intermediate fusion-bonding material 95*a* are prepared as a material 7*a* of the transducer 7. The first dielectric material 93*a* and the second dielectric material 94*a* are formed from non-thermoplastic elastomers. That is, the first dielectric material 93*a* and the second dielectric material 94*a* are not melted even if heat from the pair of rollers 41 and 42 is delivered thereto.

The first dielectric material 93*a* and the second dielectric material 94*a* are integrally and mechanically engaged with the first electrode sheet 21 and the second electrode sheet 22 by causing the first dielectric material 93*a* and the second dielectric material 94*a* to adhere to the first electrode sheet 21 and the second electrode sheet 22 through dipping, spraying, coating, or the like similar to the fifth example.

The intermediate fusion-bonding material 95*a* is formed from a thermoplastic material elastomer. That is, the intermediate fusion-bonding material 95*a* is a material that is different from those of the first dielectric material 93*a* and the second dielectric material 94*a*. However, a modulus of elasticity in a state in which the intermediate fusion-bonding material 95*a* is solidified may be substantially the same as those of the first dielectric material 93*a* and the second dielectric material 94*a*. The intermediate fusion-bonding material 95*a* is formed in the form of particles and is melted when heat is applied thereto.

In addition, a laminated body is formed by laminating (a) the member in which the first electrode sheet 21 and the first dielectric material 93*a* are integrated, (c) the intermediate fusion-bonding material 95*a*, and the member in which the second electrode sheet 22 and the second dielectric material 94*a* are integrated in this order. The laminated material 7*a* (laminated body) is transported to the right side in FIG. 10 and is caused to enter between the pair of rollers 41 and 42. That is, the pair of rollers 41 and 42 perform pressurization and heating on the side of the first outer surface 21c of the first electrode sheet 21 and perform pressurization and heating on the side of the second outer surface 22c of the second electrode sheet 22. In this manner, the heat from the pair of rollers 41 and 42 is mainly delivered to the intermediate fusion-bonding material 95a, and the intermediate fusion-bonding material 95a is melted. Thus, the melted intermediate fusion-bonding material 95a forms the intermediate fusion-bonding layer 95 that joins directly the first dielectric material 93a and the second dielectric material 94a.

Also, the first dielectric material 93a forms the first protective layer 96 that covers the first outer surface 21c of the first electrode sheet 21 in advance. In addition, the second dielectric material 94a forms the second protective layer 97 that covers the second outer surface 22c of the second electrode sheet 22 in advance.

The transducer 7 manufactured as described above includes the first electrode sheet 21, the second electrode sheet 22, the first dielectric layer 93, the second dielectric layer 94, the intermediate fusion-bonding layer 95, the first protective layer 96, and the second protective layer 97. It is also possible to reduce VOC discharge similar to the first example by the manufacturing method. Further, since the entire electrostatic sheet that forms the transducer 7 has breathability, it is possible to place the electrostatic sheet that forms the transducer 7 at a location at which breathability is required.

11. Seventh Example

A transducer 8 and a method for manufacturing the transducer 8 in the seventh example will be described with reference to FIG. 11. The same reference numerals will be used to denote components the same as those in the first example, and detailed description thereof will be omitted.

Figure 11:
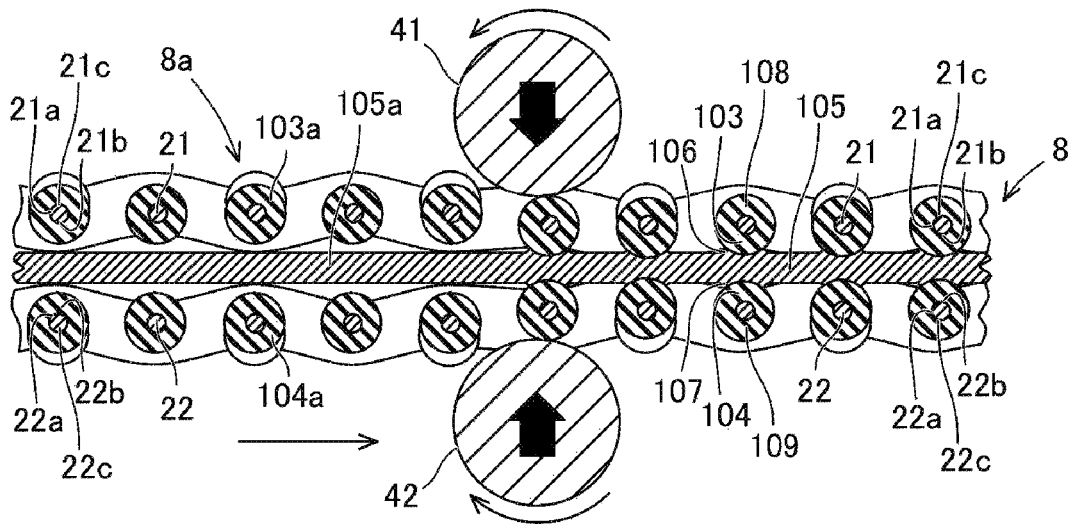
FIG. 11 is a diagram illustrating a method for manufacturing a transducer in a seventh example.

As illustrated on the left side in FIG. 11, (a) a member in which the first electrode sheet 21 and a first dielectric material 103a are integrated, (b) a member in which the second electrode sheet 22 and a second dielectric material 104a are integrated, and (c) an intermediate fusion-bonding material 105a are prepared as a material 8a of the transducer 8. Here, the first dielectric material 103a and the second dielectric material 104a are formed from non-thermoplastic elastomers. Meanwhile, the intermediate dielectric material 105a is formed from a thermoplastic elastomer. A foaming material of the thermoplastic material elastomer is used for the intermediate dielectric material 105a. That is, the intermediate dielectric material 105a has holes that establishes communication in the lamination direction. Also, the first dielectric material 103a and the second dielectric material 104a are integrated with the first electrode sheet 21 and the second electrode sheet 22 by a method similar to that in the third example.

Next, a laminated body is formed by laminating (a) the member in which the first electrode sheet 21 and the first dielectric material 103a are integrated, (c) the intermediate dielectric material 105a, and (b) the member in which the second electrode sheet 22 and the second dielectric material 104a are integrated in this order as illustrated on the left side in FIG. 11. The laminated material 8a (laminated body) is transported to the right side in FIG. 11 and is caused to enter between the pair of rollers 41 and 42. That is, the pair of rollers 41 and 42 perform pressurization and heating on the side of the first outer surface 21c of the first electrode sheet 21 and perform pressurization and heating on the side of the second outer surface 22c of the second electrode sheet 22. In this manner, the heat from the pair of rollers 41 and 42 is delivered to a portion of the intermediate dielectric material 105a on the side of the first dielectric material 103a and a portion of the intermediate dielectric material 105a on the side of the second dielectric material 104a, and the portions to which the heat is delivered is melted.

Thus, the part of the first dielectric material 103a enters the intermediate dielectric material 105a. Then, a part of the intermediate dielectric material 105a is fusion-bonded to the first dielectric material 103a with solidification of the melted intermediate dielectric material 105a. In this manner, the first intermediate fusion-bonding layer 106 in which a part of the intermediate dielectric material 105a is applied as the first intermediate fusion-bonding material is formed. That is, the first intermediate fusion-bonding layer 106 is formed from the same material constituent as that of the body portion of the intermediate dielectric layer 105.

Similar to the first dielectric material 103a, a part of the second dielectric material 104a enters the intermediate dielectric material 105a. Then, a part of the intermediate dielectric material 105a is fusion-bonded to the second dielectric material 104a with solidification of the melted intermediate dielectric material 105a. In this manner, the second intermediate fusion-bonding layer 107 in which the part of the intermediate dielectric material 105a is applied as the second intermediate fusion-bonding material is formed. That is, the second intermediate fusion-bonding layer 107 is formed from the same material constituent as that of the body portion of the intermediate dielectric layer 105.

In this manner, the first dielectric material 103a and the second dielectric material 104a are joined indirectly via the intermediate dielectric layer 105, the first intermediate fusion-bonding layer 106, and the second intermediate fusion-bonding layer 107.

In addition, the first dielectric material 103a forms the first protective layer 108 that covers the first outer surface 21c of the first electrode sheet 21 in advance. Also, the second dielectric material 104a forms the second protective layer 109 that covers the second outer surface 22c of the second electrode sheet 22 in advance.

The transducer 8 manufactured as described above includes the first electrode sheet 21, the second electrode sheet 22, the first dielectric layer 103, the second dielectric layer 104, the intermediate dielectric layer 105, the first intermediate fusion-bonding layer 106, the second intermediate fusion-bonding layer 107, the first protective layer 108, and the second protective layer 109. It is also possible to reduce VOC discharge similar to the first example by the manufacturing method. Further, since the entire transducer 8 has breathability, it is possible to place the transducer 8 at a location at which breathability is required.

12. Eighth Example

A transducer 9 and a method for manufacturing the transducer 9 in the eighth example will be described with reference to FIG. 12. The same reference numerals will be used to denote components the same as those in the first example, and detailed description thereof will be omitted.

Figure 12:
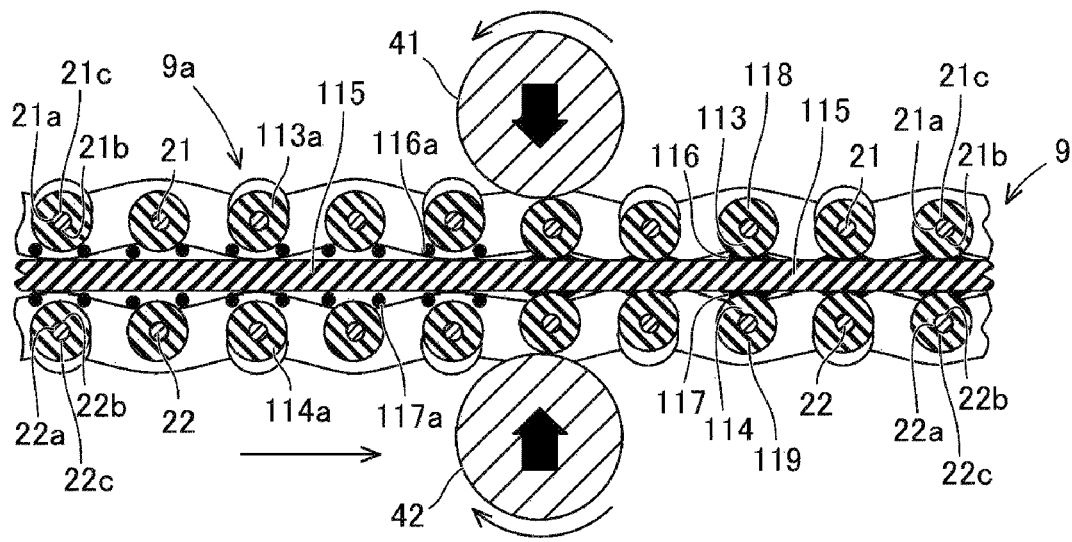
FIG. 12 is a diagram illustrating a method for manufacturing a transducer in an eighth example.

As illustrated on the left side in FIG. 12, (a) a member in which the first electrode sheet 21 and a first dielectric material 113a are integrated, (b) a member in which the second electrode sheet 22 and a second dielectric material 114a are integrated, (c) an intermediate dielectric layer 115, (d) a first intermediate fusion-bonding material 116a, and (e) a second intermediate fusion-bonding material 117*a* are prepared as a material 9*a* of the transducer 9.

The first dielectric material 113*a*, the second dielectric material 114*a*, and the intermediate dielectric layer 115 are formed from non-thermoplastic material elastomers. That is, the first dielectric material 113*a*, the second dielectric material 114*a*, and the intermediate dielectric layer 115 are not melted even when the heat from the pair of rollers 41 and 42 is delivered thereto.

The first dielectric material 113*a* and the second dielectric material 114*a* are integrally and mechanically engaged with the first electrode sheet 21 and the second electrode sheet 22 by being caused to adhere to the first electrode sheet 21 and the second electrode sheet 22 through dipping, spraying, coating, or the like similar to the fifth example.

The first intermediate fusion-bonding material 116*a* and the second intermediate fusion-bonding material 117*a* are formed from thermoplastic material elastomers. That is, the first intermediate fusion-bonding material 116*a* and the second intermediate fusion-bonding material 117*a* are materials that are different from those of the first dielectric material 113*a*, the second dielectric material 114*a*, and the intermediate dielectric layer 115. However, a modulus of elasticity in a state in which the first intermediate fusion-bonding material 116*a* and the second intermediate fusion-bonding material 117*a* are solidified may be substantially the same as that of the first dielectric material 113*a*, the second dielectric material 114*a*, and the intermediate dielectric layer 115. The intermediate fusion-bonding material 95*a* is formed in the form of particles and is melted when heat is applied thereto.

Then, a laminated body is formed by laminating (a) the member in which the first electrode sheet 21 and the first dielectric material 113*a* are integrated, (d) the first intermediate fusion-bonding material 116*a*, (c) the intermediate dielectric layer 115, (e) the second intermediate fusion-bonding material 117*a*, and (b) the member in which the second electrode sheet 22 and the second dielectric material 114*a* are integrated in this order. However, although the example will be described on the assumption of the state in which both the surfaces of the transducer 9 are manufactured at the same time, each surface of the transducer 9 may be manufactured one by one. In this case, (a) the member in which the first electrode sheet 21 and the first dielectric material 113*a* are integrated, (d) the first intermediate fusion-bonding material 116*a*, and (c) the intermediate dielectric layer 115 are laminated in this order to form one surface, and (f) the manufactured article corresponding to one surface, (e) the second intermediate fusion-bonding material 117*a*, and (b) the member in which the second electrode sheet 22 and the second dielectric material 114*a* are integrated are then laminated in this order to manufacture the other surface.

Returning to FIG. 12, and description will be continued. The laminated material 9*a* (laminated body) is transported to the right side in FIG. 12 and is caused to enter between the pair of rollers 41 and 42. That is, the first roller 41 performs pressurization and heating on the side of the first outer surface 21*c* of the first electrode sheet 21. In this manner, the heat from the first roller 41 is delivered to the first intermediate fusion-bonding material 116*a*, and the first intermediate fusion-bonding material 116*a* is melted. Thus, the melted first intermediate fusion-bonding material 116*a* forms the first intermediate fusion-bonding layer 116 that joins the first dielectric material 113*a* and the intermediate dielectric layer 115.

Similar to the first roller 41, the second roller 42 performs pressurization and heating on the side of the second outer surface 22*c* of the second electrode sheet 22. In this manner, the heat from the second roller 42 is delivered to the second intermediate fusion-bonding material 117*a*, and the second intermediate fusion-bonding material 117*a* is melted. Thus, the melted second intermediate fusion-bonding material 117*a* forms the second intermediate fusion-bonding layer 117 that joins the second dielectric material 114*a* and the intermediate dielectric layer 115.

In addition, the first dielectric material 113*a* forms the first protective layer 118 that covers the first outer surface 21*c* of the first electrode sheet 21 in advance. Also, the second dielectric material 114*a* forms the second protective layer 119 that covers the second outer surface 22*c* of the second electrode sheet 22 in advance.

The transducer 9 manufactured as described above includes the first electrode sheet 21, the second electrode sheet 22, the first dielectric layer 113, the second dielectric layer 114, the intermediate dielectric layer 115, the first intermediate fusion-bonding layer 116, the second intermediate fusion-bonding layer 117, the first protective layer 118, and the second protective layer 119. It is possible to reduce VOC discharge similar to the first example by the manufacturing method. Further, since the entire transducer 9 has breathability, it is possible to place the transducer 9 at a location where breathability is required.

13. Ninth Example

An electrostatic sheet that forms a transducer 10 in the ninth example and a method for manufacturing the electrostatic sheet will be described with reference to FIGS. 13 and 14. The same reference numerals will be used to denote components the same as those in the first example, and detailed description thereof will be omitted. Here, the transducer 10 in the ninth example will be described as a modification configuration of the transducer 2 in the first example. However, configurations unique to the transducer 10 in the ninth example, that is, a first electrode sheet 121 and a second electrode sheet 122 may be replaced with the first electrode sheet 21 and the second electrode sheet 22 in the other examples.

Figure 13:
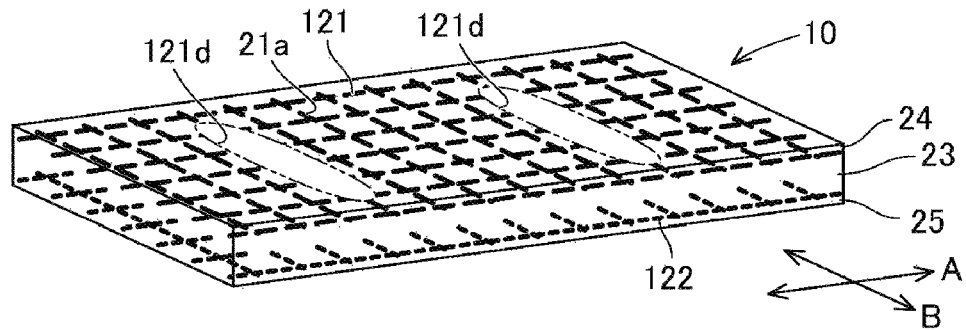
FIG. 13 is a perspective view of a transducer in a ninth example.

As illustrated in FIG. 13, the transducer 10 includes an electrostatic sheet including the first electrode sheet 121, the second electrode sheet 122, the dielectric layer 23, the first protective layer 24, and the second protective layer 25. As illustrated in FIG. 14, a laminated body is formed by laminating (a) the first electrode sheet 121, (b) the dielectric material 23*a*, and (c) the second electrode sheet 122 in this order similar to the first example. Next, the pair of rollers 41 and 42 (illustrated in FIG. 4) perform pressurization and heating, thereby burying the first electrode sheet 121 and the second electrode sheet 122 in the dielectric material 23*a* as illustrated in FIG. 13. In this manner, the electrostatic sheet that forms the transducer 10 is manufactured.

Here, the first electrode sheet 121 is a conductive cloth that is substantially similar to that of the first electrode sheet 21 in the first example. However, the first electrode sheet 121 is different from the first electrode sheet 21 in the first example in that the first electrode sheet 121 includes a plurality of first slits 121*d* as illustrated in FIGS. 13 and 14.

The first electrode sheet 121 includes the plurality of first slits 121*d* aligned in a main direction. Here, the main direction means a predetermined direction of the first electrode sheet 121. In FIG. 13, a case in which the main direction corresponds to a longitudinal direction of the first electrode sheet 121 is exemplified. That is, the main direction is the direction A illustrated in FIG. 13. Also, a sub direction is a direction at an angle relative to the main direction, for example, a direction that perpendicularly intersects with the main direction or the like. For example, the sub direction in FIG. 13 is the short-side direction of the first electrode sheet 121, that is, the direction B in FIG. 13.

Figure 14:
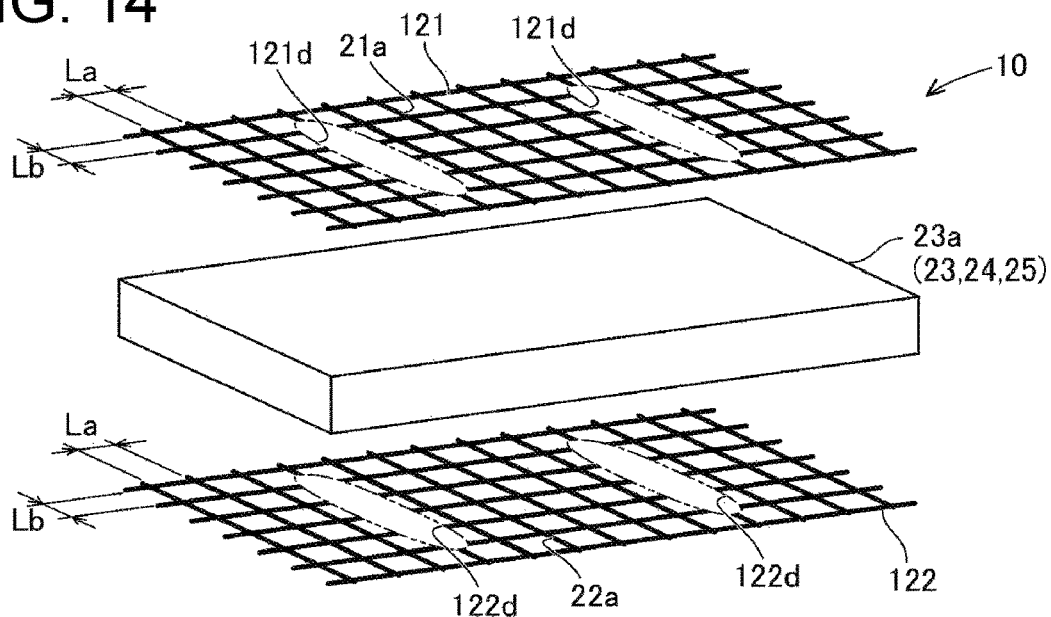
FIG. 14 is a perspective view illustrating a material of the transducer in the ninth example.

The first slits 121d may be formed such that the first slits 121d have regions in a state in which the first electrode sheet 121 is not stretched as illustrated in FIGS. 13 and 14. The shapes of the regions can be various shapes such as circles, ovals, squares, rectangles, parallelograms, trapezoids, triangles, other polygons, and shapes surrounded by arbitrary lines. Also, the first slits 121d may be linearly formed in the state in which the first electrode sheet 121 is not stretched.

In FIGS. 13 and 14, the first slits 121d are formed into oval shapes that extend in the sub direction. That is, the first slits 121d are formed to be longer than the opening length of the first through-holes 21a in the sub direction. Further, the first slits 121d are formed at the center of the first electrode sheet 121 in the sub direction. That is, the first slits 121d are not formed at both ends of the first electrode sheet 121 in the sub direction and have distances from both ends in the sub direction. Also, the first slits 121d allow at least the first electrode sheet 121 to be stretched in the main direction through expansion deformation of the first slits 121d in the main direction.

Here, the first slits 121d are also formed to be longer than the opening length of the first through-holes 21a in the main direction. Therefore, the first slits 121d also allow the first electrode sheet 121 to be stretched in the sub direction through expansion deformation of the first slit 121d in the sub direction.

The second electrode sheet 122 is similar to the first electrode sheet 121. That is, the second electrode sheet 122 is different from the second electrode sheet 22 in the first example in that the second electrode sheet 122 includes a plurality of second slits 122d as illustrated in FIG. 14. In addition, the second slits 122d are similar to the first slits 121d.

In addition, portions corresponding to the first slits 121d and portions corresponding to the second slits 122d are filled with the dielectric layer 23 formed from the elastomer. The portions corresponding to the first slits 121d include the inside of the first slits 121d and regions in the normal line direction with respect to the first slits 121d.

Therefore, the first slits 121d experience expansion deformation, and the dielectric layer 23 at the portions corresponding to the first slits 121d is stretched in a case in which the electrostatic sheet that forms the transducer 10 is stretched in the main direction. Further, the second slits 122d experience expansion deformation, and the dielectric layer 23 at the portions corresponding to the second slits 122d is stretched. In this manner, the electrostatic sheet that forms the transducer 10 can be widely stretched in the main direction. Further, the electrostatic sheet can also be stretched in the sub direction. However, the amount of the extension in the sub direction is smaller than the amount of extension in the main direction.

The electrostatic sheet that forms the transducer 10 in the example is useful in a case in which a surface of an object with a three-dimensional shape is covered with the electrostatic sheet. That is, the electrostatic sheet is disposed along the surface of the object by disposing the electrostatic sheet on the surface of the object while causing the electrostatic sheet to be stretched. That is, it is possible to neatly and easily dispose the electrostatic sheet and thereby to achieve satisfactory design properties of the object in the state in which the object is covered with the electrostatic sheet. The transducer 10 can be applied, for example, to a surface of a mouse that is a pointing device, a surface of a steering wheel for a vehicle, a door handle for a vehicle, a shift lever for a vehicle, and the like.

14. First Modification Configuration of Ninth Example

Figure 15:
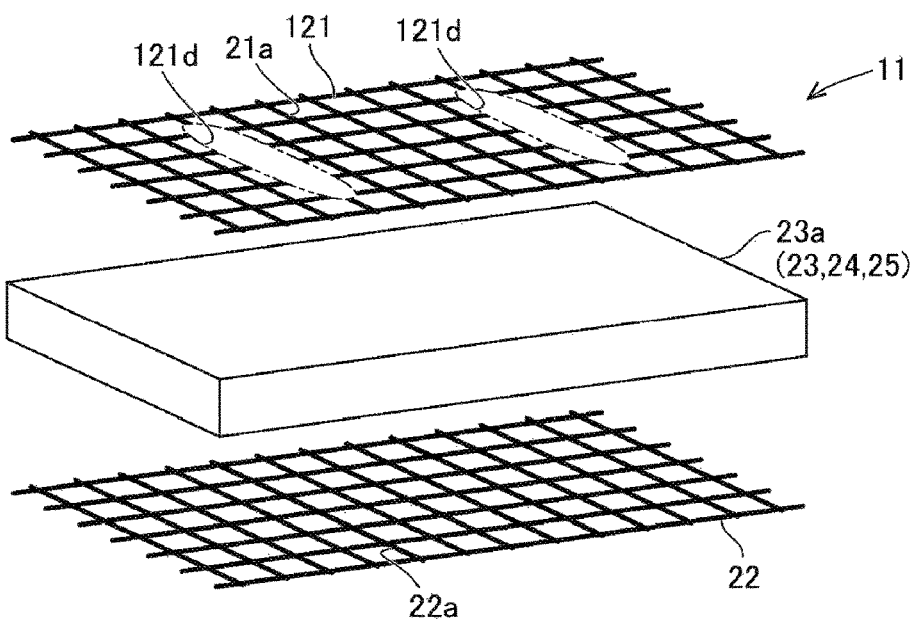
FIG. 15 is a perspective view illustrating a material of a transducer in a first modification configuration of the ninth example.

An electrostatic sheet that forms a transducer 11 in a first modification configuration of the ninth example will be described with reference to FIG. 15. The first electrode sheet 121 includes the first slits 121d, and the second electrode sheet 122 includes the second slits 122d, in the electrostatic sheet that forms the aforementioned transducer 10 in the ninth example. Instead of this configuration, the first electrode sheet 121 includes the first slits 121d, and the second electrode sheet 122 may not include the second slits in the electrostatic sheet that forms the transducer 11 as illustrated in FIG. 15.

In this case, it is possible to provide a difference between rigidity on the side of the first surface and rigidity on the side of the second surface in the electrostatic sheet. In a case in which the electrostatic sheet is disposed on a surface of an object with a three-dimensional shape, for example, the surface of the object is assumed to have a projecting shape. In this case, the first electrode sheet 121 with the first slits 121d is located on the side of the surface of the object, and the second electrode sheet 122 without the second slits is located on the inner side of the object. In this manner, it is possible to neatly and easily dispose the electrostatic sheet.

15. Second Modification Configuration of Ninth Example

Figure 16:
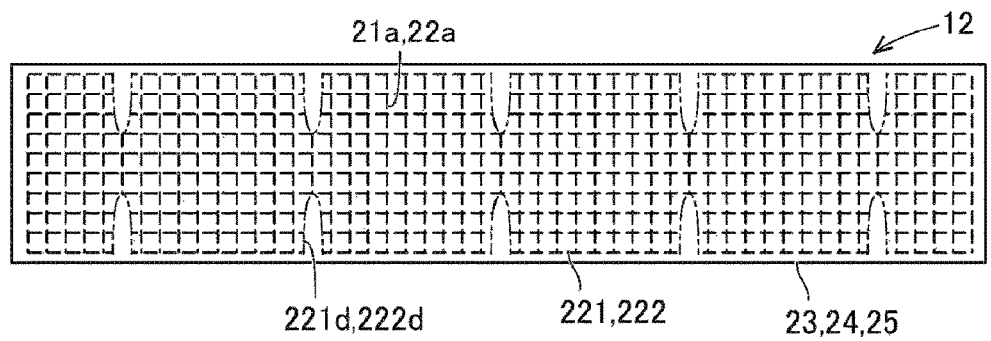
FIG. 16 is a plan view illustrating a transducer in a second modification configuration of the ninth example.

An electrostatic sheet that forms a transducer 12 in a second modification example of the ninth example will be described with reference to FIG. 16. In the electrostatic sheet that forms the aforementioned transducer 10 in the ninth example, the first slit 121d and the second slit 122d are formed at the center in the sub direction. Meanwhile, first slits 221d of a first electrode sheet 221 and second slits 222d of a second electrode sheet 222 are formed at both ends of the electrostatic sheet that forms the transducer 12 in the width direction and are not formed at the center in the sub direction, as illustrated in FIG. 16. In this case, effects similar to those of the transducer 10 in the ninth example are also achieved.

16. Third Modification Configuration of Ninth Example

Figure 17:
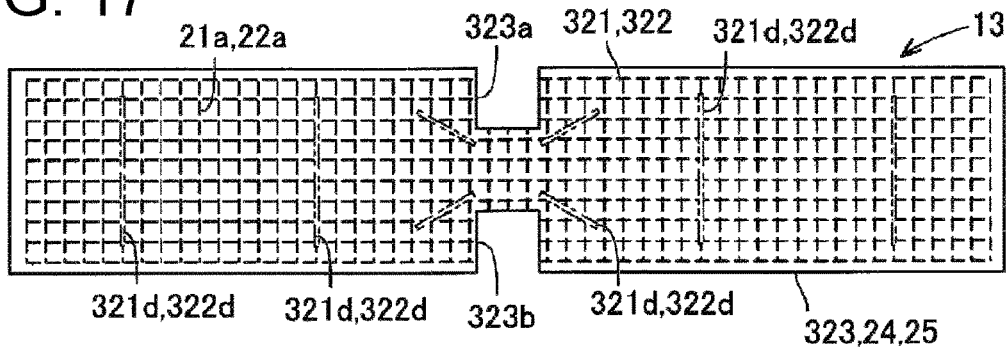
FIG. 17 is a plan view illustrating a transducer in a third modification configuration of the ninth example.

An electrostatic sheet that forms a transducer 13 in a third modification example of the ninth example will be described with reference to FIG. 17. In the electrostatic sheet that forms the transducer 13, notches 323a and 323b are formed at both ends of the dielectric layer 323 in the sub direction.

In a first electrode sheet 321, first slits 321d are linearly formed. In a second electrode sheet 322, second slits 322d are also linearly formed. The first slits 321d and the second slits 322d are formed in line shapes extending in the sub direction at positions away from the notches 323a and 323b. Meanwhile, the first slits 321d and the second slits 322d are formed so as to extend in directions at angles relative to the main direction and the sub direction (inclined direction relative to the main direction) at positions in the vicinity of the notches 323a and 323b.

The first slits 321d and the second slits 322d that extend in the sub direction act substantially similar to the first slits 121d and the second slits 122d in the ninth example. Meanwhile, the first slits 321d and the second slits 322d extending in the inclined directions act so as to prevent concentration of a stress at the notches 323a and 323b. Therefore, it is preferable to set the positions and the extending directions of the first slits 321d and the second slits 322d in accordance with the shape of the dielectric layer 323.

17. Fourth Modification Configuration of Ninth Example

Figure 18:
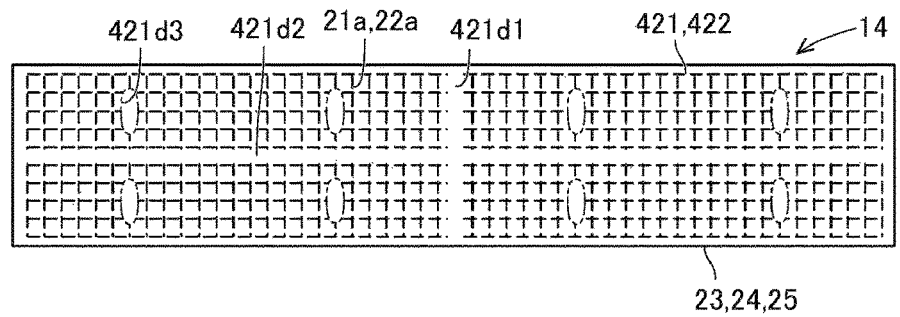
FIG. 18 is a plan view illustrating a transducer in a fourth modification configuration of the ninth example.

An electrostatic sheet that forms a transducer 14 in a fourth modification configuration of the ninth example will be described with reference to FIG. 18. In the electrostatic sheet that forms the transducer 14, a first electrode sheet 421 includes a plurality of types of first slits 421d1, 421d2, and 421d3. The first slit 421d1 is formed so as to connect two positions (positions at both ends) on an outer edge of the first electrode sheet 421 in the sub direction. The first slit 421d2 is formed so as to connect two positions (positions at both ends) on the outer edge of the first electrode sheet 421 in the main direction. That is, the two types of first slits 421d1 and 421d2 divide a detection region on the first electrode sheet 421 into a plurality of (four) regions. Although the two types of first slits 421d1 and 421d2 in linear shapes are exemplified here, arbitrary lines such as curved lines, folded lines, and the like can be employed.

Further, the first slit 421d3 is formed into an oval shape extending in an oval shape extending in the sub direction in each divided region. However, the first slit 421d3 can have an arbitrary shape as described in the ninth example. In addition, the second electrode sheet 422 is formed similar to the first electrode sheet 421.

This example is effective in the case in which the detection region is divided into the plurality of regions. Since the number of the electrostatic sheet that forms the transducer 14 is one, various effects caused by forming the electrostatic sheet as one part are achieved even if the detection region is divided in this manner.

18. Tenth Example

A transducer 15 in a tenth example will be described with reference to FIG. 19. The same reference numerals will be used to denote components the same as those in the first example, and detailed description will be omitted. Here, the transducer 15 in the tenth example will be exemplified as a modification example of the transducer 2 in the first example. However, a configuration unique to the transducer 15 in the tenth example, that is, a configuration in which a first lead line 526 and a second lead line 527 are added can also be applied to the other examples.

Figure 19:
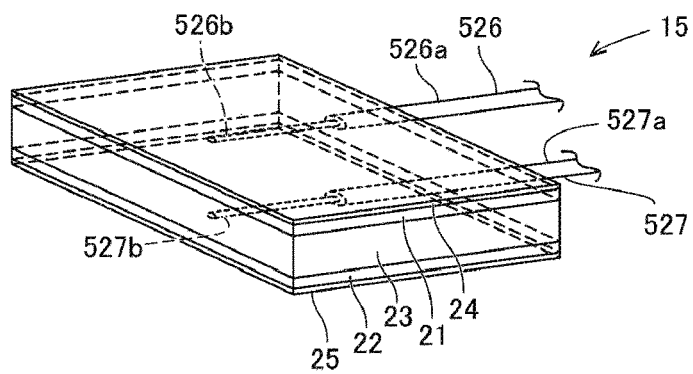
FIG. 19 is a perspective view illustrating a transducer in a tenth example.

As illustrated in FIG. 19, the transducer 15 includes an electrostatic sheet including the first electrode sheet 21, the second electrode sheet 22, the dielectric layer 23, the first protective layer 24, the second protective layer 25, the first lead line 526, and the second lead line 527.

The first lead line 526 includes a body portion 526a in which a conductive wire is covered with an insulating material and a conductive portion 526b at which the conductive wire is exposed. The body portion 526a of the first lead line 526 on the side of the tip end is disposed on the side of the first inner surface 21b of the first electrode sheet 21. The conductive portion 526b of the first lead line 526 is also disposed on the side of the first inner surface 21b of the first electrode sheet 21. That is, both the body portion 526a on the side of the tip end and the conductive portion 526b of the first lead line 526 are sandwiched between the first electrode sheet 21 and the body portion of the dielectric layer 23. The body portion 526a of the first lead line 526 extends from a portion between the first electrode sheet 21 and the body portion of the dielectric layer 23 to the outside. In addition, the conductive portion 526b of the first lead line 526 is electrically connected to the first electrode sheet 21.

The second lead line 527 includes a body portion 527a in which a conductive wire is covered with an insulating material and a conductive portion 527b at which the conductive wire is exposed. The body portion 527a of the second lead line 527 on the side of the tip end is disposed on the side of the second inner surface 22b of the second electrode sheet 22. The conductive portion 527b of the second lead line 527 is disposed on the side of the second inner surface 22b of the second electrode sheet 22. That is, both the body portion 527a of the second lead line 527 on the side of the tip end and the conductive portion 527b are sandwiched between the second electrode sheet 22 and the body portion of the dielectric layer 23. The body portion 527a of the second lead line 527 extends from a portion between the second electrode sheet 22 and the body portion of the dielectric layer 23 to the outside. In addition, the conductive portion 527b of the second lead line 527 is electrically connected to the second electrode sheet 22.

Figure 20:
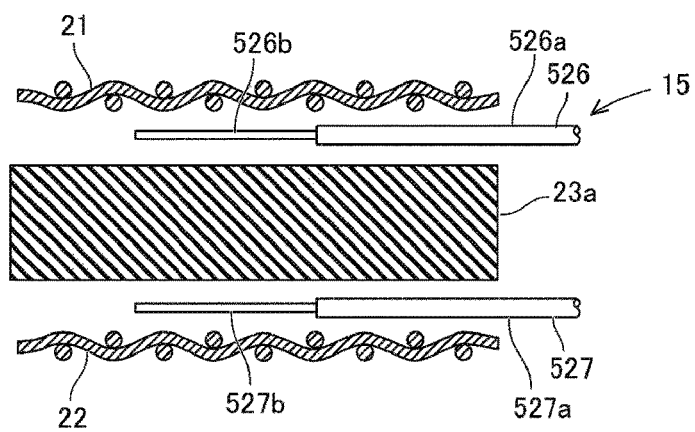
FIG. 20 is a sectional view illustrating a material of the transducer in the tenth example.
Figure 21:
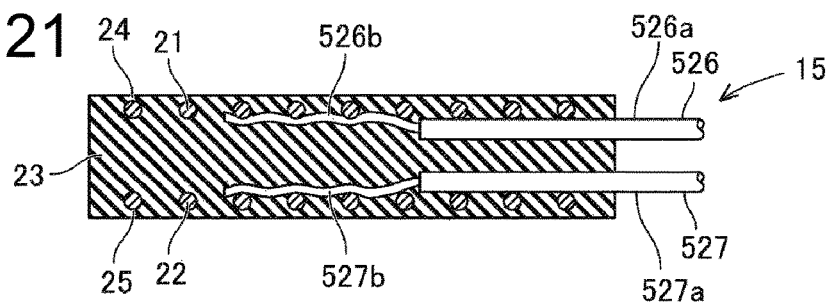
FIG. 21 is a sectional view illustrating the transducer in the tenth example.

A method for manufacturing the electrostatic sheet that forms the transducer 15 will be described with reference to FIGS. 20 and 21. As illustrated in FIG. 20, a laminated body is formed by laminating (a) the first electrode sheet 21, (b) the first lead line 526, (c) the dielectric material 23a, (d) the second lead line 527, and (e) the second electrode sheet 22 in this order. Next, the pair of rollers 41 and 42 (illustrated in FIG. 4) perform pressurization and heating, thereby burying the first electrode sheet 21 and the first lead line 526 in the dielectric material 23a on the side of the first surface as illustrated in FIG. 21. In addition, the second electrode sheet 22 and the second lead line 527 are buried in the dielectric material 23a on the side of the second surface. In this manner, the electrostatic sheet that forms the transducer 15 is manufactured.

As illustrated in FIG. 21, it is possible to prevent the thickness of the electrostatic sheet portions at which the first lead line 526 and the second lead line 527 are present. Therefore, satisfactory design of the electrostatic sheet can be achieved. Further, it is not necessary to provide a conductive joining material such as a solder or a conductive resin in order to electrically connect the first electrode sheet 21 and the first lead line 526. As a result, it is possible to reduce costs.

19. First Modification Configuration of Tenth Example

Figure 22:
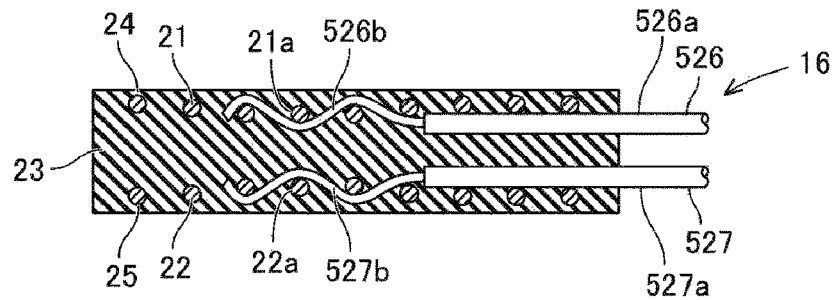
FIG. 22 is a sectional view illustrating a transducer in a first modification configuration of the tenth example.

An electrostatic sheet that forms a transducer 16 in a first modification configuration of the tenth example will be described with reference to FIG. 22. In the transducer 16, the conductive portion 526b of the first lead line 526 is twined around the first electrode sheet 21 via the first through-holes 21a. In this manner, it is possible to obtain a reliable electrical connection state between both the conductive portion 526b and the first electrode sheet 21. The state in which the conductive portion 526b is twined around the first electrode sheet 21 is obtained in advance, and the conductive portion 526b and the first electrode sheet 21 are then fusion-bonded to the body portion of the dielectric layer 23 through pressurization and heating performed by the pair of rollers 41 and 42 at the time of manufacturing the electrostatic sheet.

In addition, the conductive portion 527b of the second lead line 527 is also twined around the second electrode sheet 22 via the second through-holes 22a. In this manner, a reliable electrical connection state between both the conductive portion 527b and the second electrode sheet 22 can be achieved. In addition, the state in which the conductive portion 527b is twined around the second electrode sheet 22 is obtained in advance, and the conductive portion 527b and the second electrode sheet 22 are then fusion-bonded to the body portion of the dielectric layer 23 through pressurization and the heating performed by the pair of rollers 41 and 42 at the time of manufacturing the electrostatic sheet.

20. Second Modification Example of Tenth Example

Figure 23:
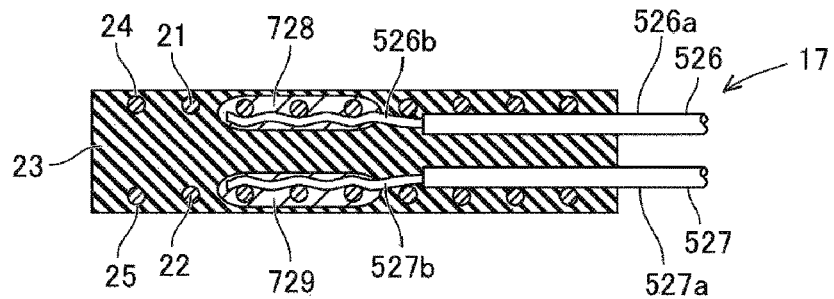
FIG. 23 is a sectional view illustrating a transducer in a second modification configuration of the tenth example.

An electrostatic sheet that forms a transducer 17 in a second modification configuration of the tenth example will be described with reference to FIG. 23. The transducer 17 further includes a first fixing layer 728 that fixes the conductive portion 526b of the first lead line 526 and the first electrode sheet 21 in an electrically connected state. The first fixing layer 728 is made of a conductive joining material such as a solder or a conductive resin. The conductive portion 526b of the first lead line 526 and the first electrode sheet 21 may be fixed to each other with the first fixing layer 728 in advance before pressurization and heating performed by the pair of rollers 41 and 42. Alternatively, the conductive portion 526b of the first lead line 526 and the first electrode sheet 21 may be fixed to each other with the first fixing layer 728 after the pressurization and the heating performed by the pair of rollers 41 and 42. In this manner, reliable electrical connection between the first electrode sheet 21 and the conductive portion 526b of the first lead line 526 is achieved.

The transducer 17 further includes a second fixing layer 729 that fixes the conductive portion 527b of the second lead line 527 and the second electrode sheet 22 in an electrically connected state. The same as that of the first fixing layer 728 applies to the second fixing layer 729.

21. Basic Configuration of Steering Wheel 18

As a transducer in another example, a steering wheel 18 will be exemplified. In this example, a steering wheel 18 that has a sensor function capable of detecting contact of human hands will be exemplified. However, not only the steering wheel 18 but also various configurations can be applied to the transducer. Although a case in which the steering wheel 18 functions only as a sensor will be exemplified below, the steering wheel 18 can have an actuator function of providing vibration or the like to a driver, for example, in addition to the sensor. In this case, the steering wheel 18 includes a sensor and an actuator. Alternatively, the steering wheel 18 can have only the actuator function instead of the sensor.

The steering wheel 18 that functions as a sensor detects that a predetermined range (predetermined area) or greater of driver's hands is in contact with the steering wheel 18. Also, the predetermined range can be arbitrarily set, and for example, the predetermined range is set to a range (area) in which the driver can perform steering in an automatic driving state.

Figure 24:
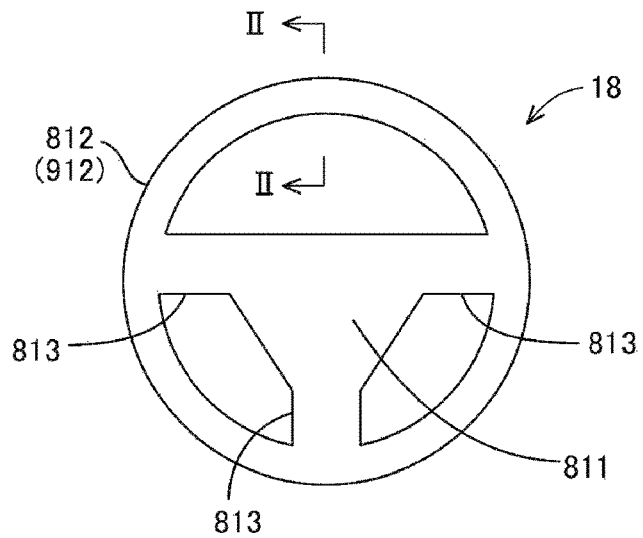
FIG. 24 is a front view of a steering wheel.

A configuration of the steering wheel 18 will be described with reference to FIG. 24. The steering wheel 18 includes a core portion 811, a gripping portion 812, and a plurality of coupling portions 813, 813, and 813 that couple the core portion 811 and the gripping portion 812 as illustrated in FIG. 24. The gripping portion 812 is a portion that the driver grips for steering. The gripping portion 812 has the sensor function of detecting contact of human hands.

Here, the gripping portion 812 has the sensor function over the entire circumference thereof in this example. That is, the steering wheel 18 can detect contact regardless of which portion in the gripping portion 812 the driver is in contact with. However, a range in which the sensor function is provided may be set at a part of the gripping portion 812. Further, the core portion 811 and the coupling portion 813 can also be adapted to be able to detect contact of driver's hands as well as the gripping portion 812.

The gripping portion 812 is formed into a circular ring shape in a front view as illustrated in FIG. 24. However, the gripping portion 812 can be formed not only into the circular shape but also into an arbitrary shape. Also, the gripping portion 812 is not limited to a shape that continues around the entire circumference but can have such a shape that the gripping portion 812 is present only at a part on the left and right sides around the core portion 811, for example.

22. Steering Wheel 18 in First Example (22-1. Detailed Configuration of Steering Wheel 18)

A detailed configuration of the steering wheel 18 in a first example will be described with reference to FIGS. 24 and 25. In particular, a detailed configuration of the gripping portion 812 will be described.

The gripping portion 812 includes a core body 821 that serves as a conductive member, a resin inner layer material 822, an electrostatic sheet 823, and a resin outer layer material 824. The core body 821 forms a center of the gripping portion 812 and is formed into a shape corresponding to the shape of the gripping portion 812. That is, the shape of the core body 821 in a front view is formed into a circular ring shape as illustrated in FIG. 24. Also, a sectional shape of the core body 821 at a right angle relative to an axis is formed into an oval shape as illustrated in FIG. 25. Therefore, the surface of the core body 821 does not have a shape formed only by planar portions but has a curved portion. In particular, a most part of the surface of the gripping portion 812 is formed by a curved surface in this example.

Here, the sectional shape of the core body 821 at a right angle relative to the axis is not limited to the oval shape but can be an arbitrary shape such as a U shape, a C shape, or a polygonal shape. The core body 821 is formed from metal with conductivity, such as aluminum, in order to cause the core body 821 to function as a conductive member. Materials other than metal can be applied to the material of the core body 821 as long as the material has rigidity of the core body 821 and has conductivity. That is, the core body 821 functions as one electrode that forms an electrostatic capacitance of an electrostatic capacitive sensor. Further, the core body 821 is connected to a ground potential in this example. However, the core body 821 does not necessarily have a ground potential as long as the potential is constant.

The resin inner layer material 822 covers the outer surface of the core body 821 over the entire circumference of the ring front shape of the core body 821 and over the entire circumference of the oval sectional shape of the core body 821. In a case in which the core body 821 has a U-shaped sectional shape at a right angle relative to the axis, the recessed portion of the U shape of the core body 821 is also filled with the resin inner layer material 822 as well as the outer side of the core body 821 in the radial direction in the section at a right angle relative to the axis. The resin inner layer material 822 is molded on the side of the outer surface of the core body 821 through injection molding and is joined directly to the outer surface of the core body 821. The resin inner layer material 822 is formed from a foaming resin, for example. A foaming urethane resin, for example, is used for the resin inner layer material 822. In addition, a non-foaming resin can also be used for the resin inner layer material 822.

The electrostatic sheet 823 functions both as the other electrode that forms an electrostatic capacitance of the electrostatic capacitive sensor (transducer) and as a dielectric layer of the electrostatic capacitance. The electrostatic sheet 823 covers the outer surface of the resin inner layer material 822 over the entire circumference of the ring front shape of the resin inner layer material 822 and over the entire circumference of the oval sectional shape of the resin inner layer material 822. That is, the electrostatic sheet 823 is provided in the surface normal line direction of the core body 821 that serves as the conductive member and in the surface normal line direction of the resin inner layer material 822. However, in a case in which a range having the sensor function is set at a part of the gripping portion 812, covering only a part of the ring front shape of the resin inner layer material 822 with the electrostatic sheet 823 is sufficient.

The electrostatic sheet 823 is formed separately from the core body 821 and the resin inner layer material 822 and has flexibility and stretchability as a whole. The electrostatic sheet 823 is joined to the outer surface of the resin inner layer material 822 through fusion-bonding of a fusion-bonding material. The electrostatic sheet 823 can be easily deformed into a shape corresponding to the outer surface of the resin inner layer material 822 due to the flexibility and the stretchability. Here, since the configuration in which the steering wheel 18 includes the resin inner layer material 822 is exemplified in this example, the electrostatic sheet 823 is adapted to be joined to the resin inner layer material 822 on the side of the outer surface and be joined indirectly to the core body 821 that serves as the conductive member. However, the steering wheel 18 can have a configuration in which the resin inner layer material 822 is not provided. In such a case, the electrostatic sheet 823 is adapted to be joined directly to the outer surface of the core body 821 that serves as the conductive member.

The electrostatic sheet 823 is formed into a sheet shape. The electrostatic sheet 823 is provided so as to be wound around the core body 821 and the outer surface of the resin inner layer material 822 from the outer side of the gripping portion 812 in the radial direction (the outer side in the radial direction in FIG. 24 and the upper side in FIG. 25) toward the inner side in the radial direction (the inner side in the radial direction in FIG. 24 and the lower side in FIG. 25) in a front (FIG. 24) view of the gripping portion 812. Therefore, a state in which both edges of the electrostatic sheet 823 in the width direction are caused to confront with each other at a portion on the inner side of the gripping portion 812 in the radial direction (the inner side in the radial direction in FIG. 24 and the lower side in FIG. 25) is achieved. Alternatively, a state in which both edges of the electrostatic sheet 823 in the width direction face with each other with a slight gap at a portion on the inner side of the gripping portion 812 in the radial direction (the inner side in the radial direction in FIG. 24 and the lower side in FIG. 25) is achieved.

The electrostatic sheet 823 includes a first electrode sheet 831 and a dielectric layer 832. That is, the core body 821 and the first electrode sheet 831 function as a pair of electrodes that form the electrostatic capacitance of the electrostatic capacitive sensor (transducer). The dielectric layer 832 functions as a dielectric layer of the electrostatic capacitance of the electrostatic capacitive sensor (transducer).

The first electrode sheet 831 is similar to the first electrode sheet 21 described above with reference to FIG. 2. That is, the first electrode sheet 831 is, for example, a conductive cloth or the like. In addition, detailed description of the first electrode sheet 831 will be omitted. The respective portions of the first electrode sheet 831 will be described using the reference numerals of the respective portions of the aforementioned first electrode sheet 21.

The dielectric layer 832 is formed from an elastically deformable dielectric material. Specifically, the dielectric layer 832 is formed from a thermoplastic material, in particular, from a thermoplastic elastomer in some cases, and the dielectric layer 832 is formed from a non-thermoplastic material, in particular, from a non-thermoplastic elastomer in other cases. The dielectric layer 832 is formed into a desired outer shape such as a rectangular shape, for example. The dielectric layer 832 has a structure in which the dielectric layer 832 is stretched in the thickness direction and is stretched in the surface direction with the stretching in the thickness direction.

A first surface (the outer surface in FIG. 25) of the dielectric layer 832 is a surface on the side opposite to the core body 821 that serves as a conductive member and is disposed on the side of the first electrode sheet 831. The dielectric layer 832 on the side of the first surface is joined directly or indirectly to the first electrode sheet 831 through any of (a) fusion-bonding of a part of the material of the dielectric layer 832, (b) fusion-bonding of a first fusion-bonding material 833 (which will be described later) that is different from the dielectric layer 832, and (c) engagement of the dielectric layer 832 itself.

A second surface (the inner surface in FIG. 25) of the dielectric layer 832 is disposed on the side of the core body 821 that serves as the conductive member. The second surface of the dielectric layer 832 is located on the rear surface side of the first surface of the dielectric layer 832. The dielectric layer 832 on the side of the second surface is joined directly or indirectly to the core body 821 that serves as the conductive member through any of (d) fusion-bonding of a part of the material of the dielectric layer 832 and (e) fusion-bonding of a second fusion-bonding material 834 (which will be described later) that is different from the dielectric layer 832. Here, since the resin inner layer material 822 covers the outer surface of the core body 821, the second surface of the dielectric layer 832 is joined directly or indirectly to the resin inner layer material 822 on the side of the outer surface.

Figure 25:
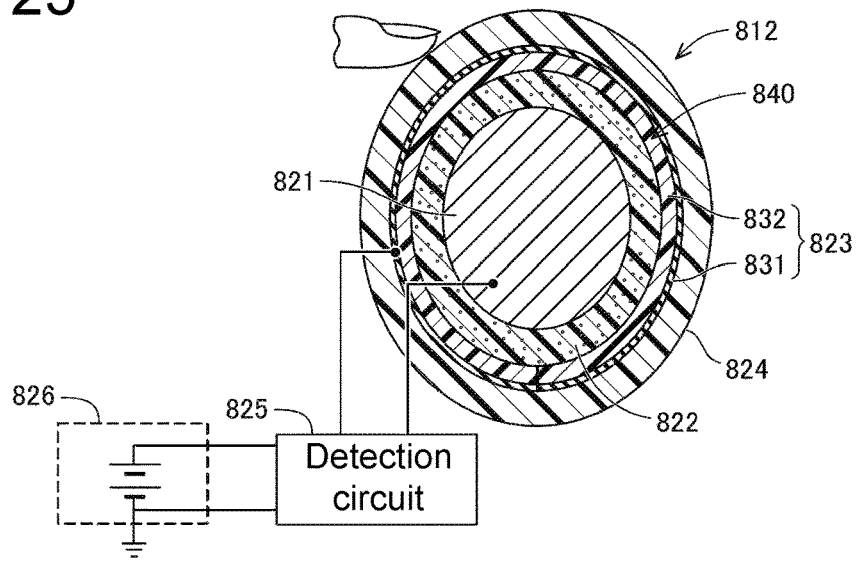
FIG. 25 illustrates an enlarged view of a section of the steering wheel in a first example taken along II-II (a section at a right angle relative to an axis) in FIG. 24 and illustrates a detection block diagram.

The resin outer layer material 824 covers the outer surface of the electrostatic sheet 823 (the surface of the electrostatic sheet 823 on the side opposite to the core body 821) over the entire circumference of the ring front shape (the entire circumference in the circumferential direction in FIG. 24) of the electrostatic sheet 823 and over the entire circumference of the oval sectional shape (the entire circumference in the circumferential direction in FIG. 25) of the electrostatic sheet 823. That is, the resin outer layer material 824 also functions as a covering material for the first electrode sheet 831 in a case in which the first electrode sheet 831 is exposed on the side of the first surface of the dielectric layer 832. The resin outer layer material 824 is molded on the outer surface side of the electrostatic sheet 823 through injection molding and is joined directly to the outer surface of the electrostatic sheet 823. The resin outer layer material 824 is molded using a urethane resin, for example. The outer surface of the resin outer layer material 824 forms a designed surface. Thus, it is preferable to use a non-foaming urethane resin or a slightly foaming urethane resin for the resin outer layer material 824.

The steering wheel 18 includes a detection circuit 825 as illustrated in FIG. 25. The detection circuit 825 is operated by electric power supplied from a power source 826. The detection circuit 825 is electrically connected to the core body 821 and the first electrode sheet 831 and detects contact or approach of driver's hands on the basis of a change in electrostatic capacitance between the core body 821 and the first electrode sheet 831. Since details of a method of detecting the electrostatic capacitance using the detection circuit 825 is known, description thereof will be omitted.

(22-2. Method for Manufacturing Steering Wheel 18)

Figure 26:
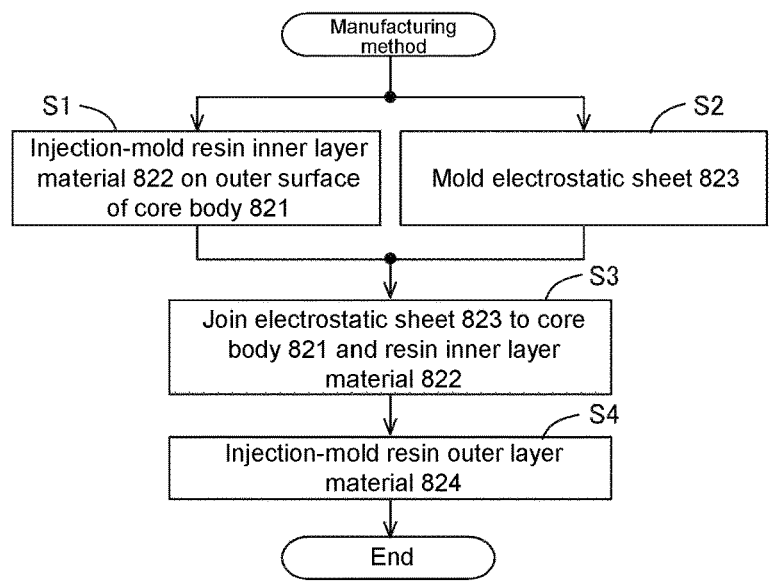
FIG. 26 is a flowchart of a method for manufacturing a steering wheel in a first example.

Next, a method for manufacturing the steering wheel 18, in particular, the gripping portion 812 will be described with reference to FIGS. 26 to 29. As illustrated in FIG. 26, the resin inner layer material 822 is injection-molded on the outer surface of the core body 821 (S1: inner layer material molding process). That is, the core body 821 is disposed in an injection molding mold (not illustrated), and a molding material is poured into the mold, thereby molding the resin inner layer material 822. In this manner, the core body 821 and the resin inner layer material 822 are integrated.

Figure 27:
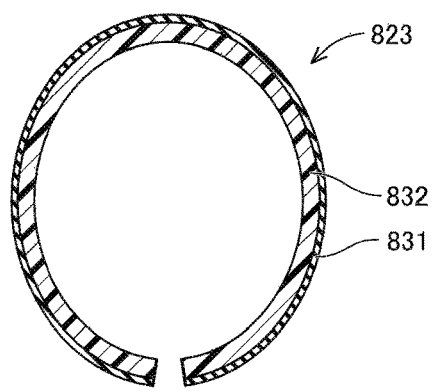
FIG. 27 is a sectional view at a right angle relative to an axis of an electrostatic sheet molded into a preliminary shape.

In parallel to S1, the electrostatic sheet 823 is molded (S2: electrostatic sheet molding process). The electrostatic sheet 823 includes the first electrode sheet 831 and the dielectric layer 832 as described above and is a member in which the first electrode sheet 831 and the dielectric layer 832 are integrated. Here, the electrostatic sheet 823 is molded into a preliminary shape corresponding to the curved surface shape of the outer surface of the core body 821 as illustrated in FIG. 27. That is, the electrostatic sheet 823 is molded to have a C-shaped section at the right angle relative to the axis as illustrated in FIG. 27 and is also molded into a shape corresponding to the ring front shape of the core body 821 as illustrated in FIG. 24. In addition, the shape of the electrostatic sheet 823 is not limited to that in FIG. 27 and may be a planar shape.

Figure 28:
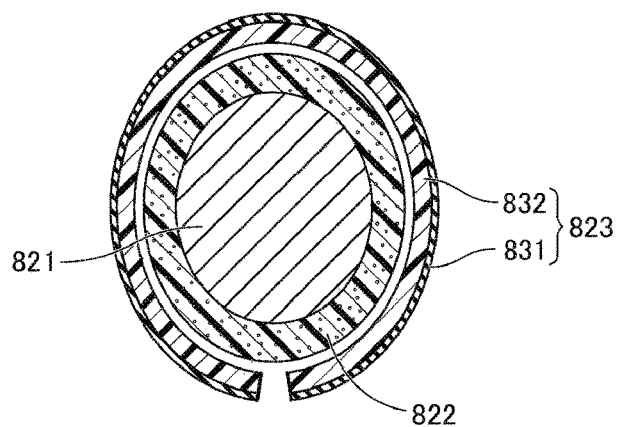
FIG. 28 is a sectional view at a right angle relative to the axis in a state in which the electrostatic sheet molded into a preliminary shape is disposed on a side of outer surfaces of a core body and a resin inner layer material.
Figure 29:
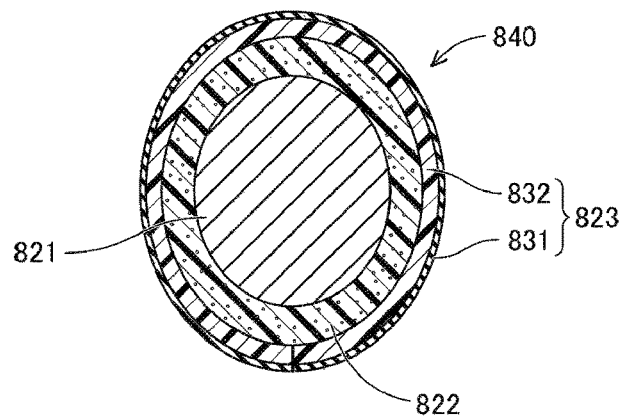
FIG. 29 is a sectional view at a right angle relative to the axis in a state in which the electrostatic sheet is joined to the outer surface of the resin inner layer material.

Next, the electrostatic sheet 823 molded in S2 is joined to the core body 821 and the resin inner layer material 822 molded in S1 (S3: electrostatic sheet joining process). That is, the electrostatic sheet with the preliminary shape is disposed at the position corresponding to the core body 821 that serves as the conductive member and the resin inner layer material 822 as illustrated in FIG. 28. The electrostatic sheet 823 is heated in this state, thereby melting the fusion-bonding material (a part of the material of the dielectric layer 832 or the second fusion-bonding material) that is a thermoplastic material as illustrated in FIG. 29. The electrostatic sheet 823 is joined to the outer surface of the resin inner layer material 822 when the fusion-bonding material (a part of the material of the dielectric layer 832 or the second fusion-bonding material) is being melted. In this manner, an intermediate molded article 840 in which the core body 821, the resin inner layer material 822, and the electrostatic sheet 823 are integrated is molded. Also, in a case in which the electrostatic sheet 823 has a planar shape, the electrostatic sheet may be heated when the electrostatic sheet 823 is being wound around the core body 821 or the resin inner layer material 822 or in a state in which the electrostatic sheet 823 is wound around the core body 821 or the resin inner layer material 822.

Next, the resin outer layer material 824 is injection-molded (S4: outer layer material molding process). That is, the integrated core body 821, the resin inner layer material 822, and the electrostatic sheet 823 are disposed in an injection molding mold (not illustrated), and a molding material is poured into the mold, thereby molding the resin outer layer material 824. In this manner, the core body 821, the resin inner layer material 822, the electrostatic sheet 823, and the resin outer layer material 824 are integrated as illustrated in FIG. 25. The gripping portion 812 of the steering wheel 18 is thus completed.

(22-3. Detailed Configuration of Electrostatic Sheet 823)

Next, a configuration of the electrostatic sheet 823 will be described in detail. The electrostatic sheet 823 is a member that is molded in the electrostatic sheet molding process in S2 in FIG. 26 and is a member in which the first electrode sheet 831 and the dielectric layer 832 are joined to each other as described above. As the electrostatic sheet 823, any of an electrostatic sheet 823a in a first example, an electrostatic sheet 823b in a second example, an electrostatic sheet 823c in a third example, and an electrostatic sheet 823d in a fourth example can be applied as will be described below.

(22-3-1. Configuration of Electrostatic Sheet 823a in First Example)

Figure 30:
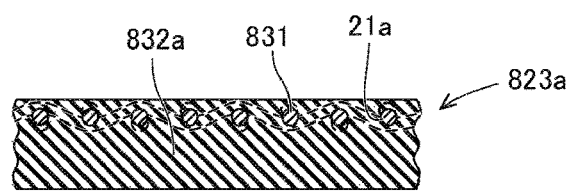
FIG. 30 is a sectional view of an electrostatic sheet in a first example.

The electrostatic sheet 823a in the first example will be described with reference to FIG. 30. The electrostatic sheet 823a in the first example includes the first electrode sheet 831 and a dielectric layer 832a in a first example. The dielectric layer 832a is formed from a thermoplastic material, in particular, a thermoplastic elastomer and is formed into a planar shape with no through-holes. Since the dielectric layer 832a is formed from a thermoplastic material, the dielectric layer 832a is brought into a melted state by applying a heat. In addition, the dielectric layer 832a on the side of the first surface (the upper surface in FIG. 30) is joined directly to the first electrode sheet 831 through fusion-bonding of a part of the material of the dielectric layer 832a in a state in which the first electrode sheet 831 is buried therein. That is, all the first electrode sheet 831 on the side of the inner surface (the lower surface in FIG. 30), the inner circumferential surfaces of the first through-holes 21a (illustrated in FIG. 2) in the first electrode sheet 831, and the first electrode sheet 831 on the side of the outer surface (the upper surface in FIG. 30) are fusion-bonded to the dielectric layer 832a.

The electrostatic sheet 823a in the first example is molded as follows, for example. The first electrode sheet 831 and the material of the dielectric layer 832a are prepared. The first electrode sheet 831 is laminated on the material of the dielectric layer 832a on the side of the first surface. In this state, the laminated body is caused to enter between a pair of pressurization and heating rollers (not illustrated). That is, the heat from the pair of pressurization and heating rollers is delivered to the first surface of the material of the dielectric layer 832a, and the dielectric layer 832a is melted. Thus, the first electrode sheet 831 is buried from and in the first surface of the material of the dielectric layer 832a. Then, the dielectric layer 832a on the side of the first surface is fusion-bonded to the first electrode sheet 831 with solidification of the material of the dielectric layer 832*a*. In this manner, the electrostatic sheet 823*a* in the first example is molded.

(22-3-2. Configuration of Electrostatic Sheet 823*b* in Second Example)

Figure 31:
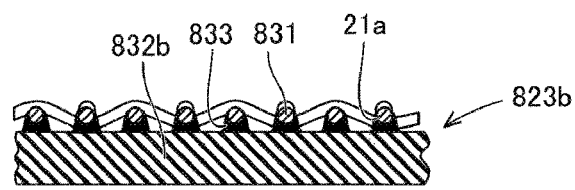
FIG. 31 is a sectional view of an electrostatic sheet in a second example.

An electrostatic sheet 823*b* in a second example will be described with reference to FIG. 31. The electrostatic sheet 823*b* in the second example includes a first electrode sheet 831 and the dielectric layer 832*b* in the second example. The dielectric layer 832*b* is formed from a non-thermoplastic material, in particular, a non-thermoplastic elastomer and is formed into a planar shape. The dielectric layer 832*b* on the side of a first surface (the upper surface in FIG. 31) is joined indirectly to the first electrode sheet 831 through fusion-bonding of a first fusion-bonding material 833. That is, the first fusion-bonding material 833 is interposed between the first electrode sheet 831 and the dielectric layer 832*b*. In addition, the first fusion-bonding material 833 is fusion-bonded to the first electrode sheet 831 on the side of an inner surface (the lower surface in FIG. 31) and at least some of the inner circumferential surfaces of the first through-holes 21*a* in the first electrode sheet 831 and is fusion-bonded to the first surface of the dielectric layer 832*b*. Also, the dielectric layer 832*b* may be made of a non-thermoplastic resin with no through-holes or may be made of a non-thermoplastic foaming resin with through-holes. In a case in which the dielectric layer 832*b* is made of a foaming resin, breathability of the electrostatic sheet 823*b* can be enhanced.

The electrostatic sheet 823*b* in the second example is molded as follows, for example. The first electrode sheet 831, the dielectric layer 832*b*, and the first fusion-bonding material 833 are prepared. The first fusion-bonding material 833 is formed in the form of fine particles or minute sheets, for example. Then, the first electrode sheet 831 is laminated on the dielectric layer 832*b* on the side of the first surface, and the first fusion-bonding material 833 is further disposed between the first surface of the dielectric layer 832*b* and the first electrode sheet 831. In this state, the laminated body is caused to enter between a pair of pressurization heating rollers (not illustrated). That is, heat from the pair of pressurization and heating rollers is delivered to the first fusion-bonding material 833, and the first fusion-bonding material 833 is melted. Thus, the melted first fusion-bonding material 833 joins the first electrode sheet 831 and the dielectric layer 832*b*. In this manner, the electrostatic sheet 823*b* in the second example is molded.

(22-3-3. Configuration of Electrostatic Sheet 823*c* in Third Example)

Figure 32:
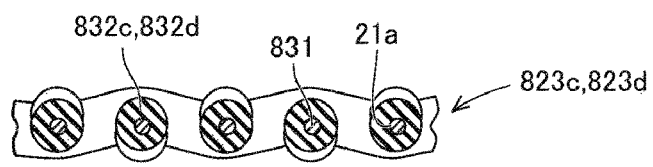
FIG. 32 is sectional views of electrostatic sheets in third and fourth examples.

An electrostatic sheet 823*c* in a third example will be described with reference to FIG. 32. The electrostatic sheet 823*c* in the third example includes the first electrode sheet 831 and the dielectric layer 832*c* in the third example. The dielectric layer 832*c* is formed from a thermoplastic material, in particular, a thermoplastic elastomer. Further, the dielectric layer 832*c* is applied, as a coating, to the surface of the first electrode sheet 831 such that the plurality of first through-holes 31*a* (illustrated in FIG. 2) in the first electrode sheet 831 are maintained. For example, the dielectric layer 832*c* is formed integrally with the first electrode sheet 831 by causing the thermoplastic material in a melted state to adhere to the entire surface of the conductive fiber of the first electrode sheet 831 through dipping, spraying, coating, or the like. That is, the dielectric layer 832*c* adheres to all the first electrode sheet 831 on the side of an inner surface (the lower surface in FIG. 32), the inner circumferential surfaces of the first through-holes 21*a* in the first electrode sheet 831, and the first electrode sheet 831 on the side of an outer surface (the upper surface in FIG. 32). Here, a state in which the first through-holes 21*a* penetrate through the first electrode sheet 831 is maintained in a state in which the dielectric layer 832*c* adheres thereto.

Since the dielectric layer 832*c* is formed from a thermoplastic material, the dielectric layer 832*c* is joined directly to the first electrode sheet 831 through fusion-bonding of a part of the material of the dielectric layer 832*c*. Further, the dielectric layer 832*c* is joined directly to the first electrode sheet 831 through mechanical engagement of the dielectric layer 832*c* itself. Here, the mechanical engagement means that the part gets mechanically caught therein.

(22-3-4. Configuration of Electrostatic Sheet 823*d* in Fourth Example)

An electrostatic sheet 823*d* in a fourth example will be described with reference to FIG. 32. The electrostatic sheet 823*d* in the fourth example includes the first electrode sheet 831 and the dielectric layer 832*d* in the fourth example. The dielectric layer 832*d* is formed from a non-thermoplastic material, in particular, a non-thermoplastic elastomer. The dielectric layer 832*d* in the fourth example is similar to the dielectric layer 832*c* in the third example other than that the dielectric layer 832*d* is formed from the non-thermoplastic material.

(22-4. Configuration of Intermediate Molded Article 840 of Gripping Portion 812)

Next, a configuration of the intermediate molded article 840 (illustrated in FIG. 29) of the gripping portion 812 will be described in detail. The intermediate molded article 840 of the gripping portion 812 is molded in the electrostatic sheet joining process in S3 in FIG. 26 and is a member in which the core body 821, the resin inner layer material 822, and the electrostatic sheet 823 are integrated as described above.

As the intermediate molded article 840, any of an intermediate molded article 840*a* in a first example, an intermediate molded article 840*b* in a second example, an intermediate molded article 840*c* in a third example, and an intermediate molded article 840*d* in a fourth example can be applied as will be described below. Here, as the electrostatic sheet 823, any of the electrostatic sheet 823*a* in the first example (FIG. 30), the electrostatic sheet 823*b* in the second example (FIG. 31), the electrostatic sheet 823*c* in the third example (FIG. 32), and the electrostatic sheet 823*d* in the fourth example (FIG. 32) can be applied. The intermediate molded articles 840*a*, 840*b*, 840*c*, and 840*d* correspond to cases in which the electrostatic sheets 823*a*, 823*b*, 823*c*, and 823*d* are applied, respectively.

(22-4-1. Configuration of Intermediate Molded Article 840*a* in First Example)

Figure 33:
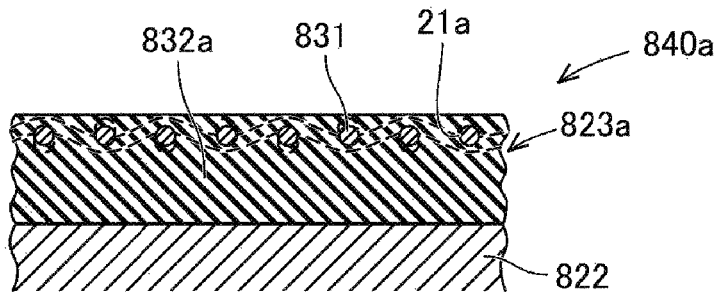
FIG. 33 is a sectional view of an intermediate molded article in a first example.

The intermediate molded article 840*a* in the first example will be described with reference to FIG. 33. The intermediate molded article 840*a* in the first example includes the electrostatic sheet 823*a* in the first example. The dielectric layer 832*a* in the electrostatic sheet 823*a* in the first example is formed from a thermoplastic material. Also, the dielectric layer 832*a* on the side of the second surface (the lower surface in FIG. 33) is joined directly to the outer surface of the resin inner layer material 822 through fusion-bonding of a part of the material of the dielectric layer 832*a*.

The intermediate molded article 840*a* in the first example is molded as follows, for example. The electrostatic sheet 823*a* with a section at a right angle relative to an axis formed into a C shape is disposed in the circumference of the core body 821 and the resin inner layer material 822 as illustrated in FIG. 28. Thereafter, hot wind is applied to the electrostatic sheet 823*a* from the outer side, and the dielectric layer 832*a* is thus deformed such that the dielectric layer 832a follows the shape of the outer surface of the resin inner layer material 822 as illustrated in FIG. 29. At the same time, the dielectric layer 832a is melted by the hot wind, and the dielectric layer 832a is joined directly to the resin inner layer material 822 through fusion-bonding of a part of the material of the dielectric layer 832a. In this manner, the intermediate molded article 840a is molded.

(22-4-2. Configuration of Intermediate Molded Article 840b in Second Example)

Figure 34:
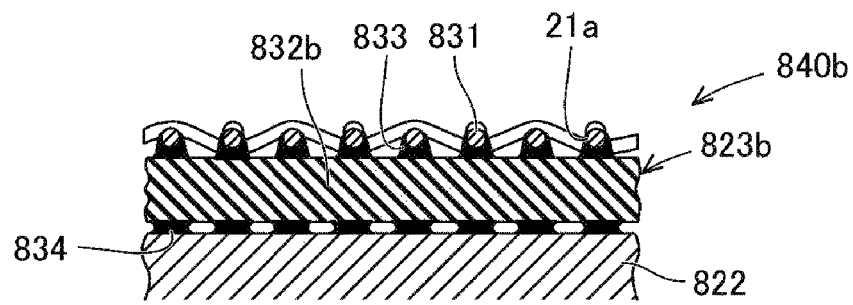
FIG. 34 is a sectional view of an intermediate molded article in a second example.

The intermediate molded article 840b in the second example will be described with reference to FIG. 34. The intermediate molded article 840b in the second example includes the electrostatic sheet 823b in the second example. The dielectric layer 832b in the electrostatic sheet 823b in the second example is formed from a non-thermoplastic material. The dielectric layer 832b on the side of the second surface (the lower surface in FIG. 34) is joined indirectly to the outer surface of the resin inner layer material 822 through fusion-bonding of the second fusion-bonding material 834. That is, the second fusion-bonding material 834 is interposed between the outer surface of the resin inner layer material 822 and the second surface of the dielectric layer 832b.

The intermediate molded article 840b in the second example is molded as follows, for example. The electrostatic sheet 823b with a section at a right angle relative to an axis formed into a C shape is disposed in the circumference of the core body 821 and the resin inner layer material 822 as illustrated in FIG. 28. At this time, the second fusion-bonding material 834 is disposed between the outer surface of the resin inner layer material 822 and the second surface of the dielectric layer 832b. The second fusion-bonding material 834 is formed in the form of fine particles or minute sheets, for example. Hot wind is applied to the electrostatic sheet 823b from the outer side in this state, the second fusion-bonding material 834 is thus melted, and the dielectric layer 832b is joined indirectly to the resin inner layer material 822 as illustrated in FIG. 29 through fusion-bonding of the second fusion-bonding material 834. In this manner, the intermediate molded article 840b is molded.

(22-4-3. Configuration of Intermediate Molded Article 840c in Third Example)

Figure 35:
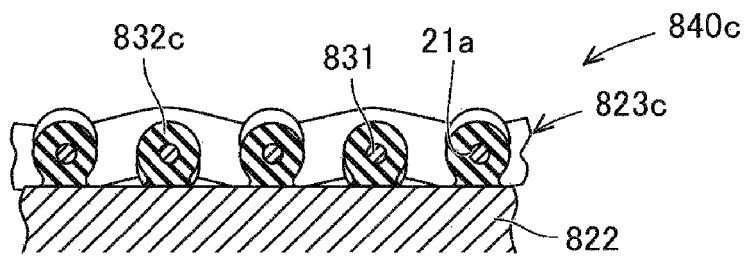
FIG. 35 is a sectional view of an intermediate molded article in a third example.

The intermediate molded article 840c in the third example will be described with reference to FIG. 35. The intermediate molded article 840c in the third example includes the electrostatic sheet 823c in the third example. The dielectric layer 832c in the electrostatic sheet 823c in the third example is formed from a thermoplastic material. In addition, the dielectric layer 832c on the side of the second surface (the lower surface in FIG. 35) is joined directly to the outer surface of the resin inner layer material 822 through fusion-bonding of a part of the material of the dielectric layer 832c.

The intermediate molded article 840c in the third example is molded as follows, for example. The electrostatic sheet 823c with a section at an angle relative to an axis formed into a C shape is disposed in the circumference of the core body 821 and the resin inner layer material 822 as illustrated in FIG. 28. Thereafter, hot wind is applied to the electrostatic sheet 823c from the outer side, and the dielectric layer 832c is thus deformed such that the dielectric layer 832c follows the shape of the outer surface of the resin inner layer material 822 as illustrated in FIG. 29. At the same time, the dielectric layer 832c is melt by the hot wind, and the dielectric layer 832c is joined directly to the resin inner layer material 822 through fusion-bonding of the dielectric layer 832c. In this manner, the intermediate molded article 840c is molded.

(22-4-4. Configuration of Intermediate Molded Article 840d in Fourth Example)

Figure 36:
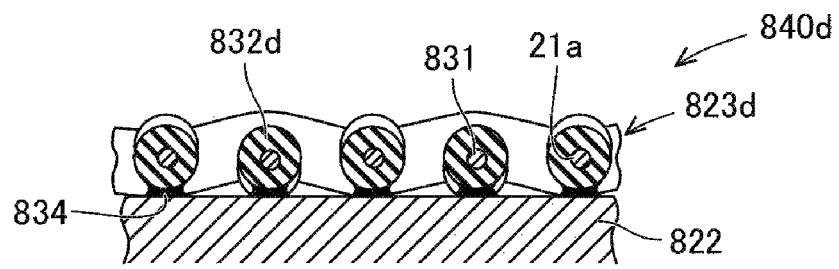
FIG. 36 is a sectional view of an intermediate molded article in a fourth example.

The intermediate molded article 840d in the fourth example will be described with reference to FIG. 36. The intermediate molded article 840d in the fourth example includes the electrostatic sheet 823d in the fourth example. The dielectric layer 832d in the electrostatic sheet 823d in the fourth example is formed from a non-thermoplastic material. The dielectric layer 832d on the side of the second surface (the lower surface in FIG. 36) is joined indirectly to the outer surface of the resin inner layer material 822 through fusion-bonding of the second fusion-bonding material 834. That is, the second fusion-bonding material 834 is interposed between the outer surface of the resin inner layer material 822 and the second surface of the dielectric layer 832d.

The intermediate molded article 840d in the fourth example is molded as follows, for example. The electrostatic sheet 823d with a section at a right angle relative to an axis formed into a C shape is disposed in the circumference of the core body 821 and the resin inner layer material 822 as illustrated in FIG. 28. At this time, the second fusion-bonding material 834 is disposed between the outer surface of the resin inner layer material 822 and the second surface of the dielectric layer 832d. The second fusion-bonding material 834 is formed in the form of fine particles or minute sheets, for example. Hot wind is applied to the electrostatic sheet 823d from the outer side in this state, the second fusion-bonding material 834 is thus melted, and the dielectric layer 832d is joined indirectly to the resin inner layer material 822 through fusion-bonding of the second fusion-bonding material 834 as illustrated in FIG. 29. In this manner, the intermediate molded article 840d is molded.

23. Effects

As described above, the electrostatic sheet 823 includes the first electrode sheet 831 and the dielectric layer 832. The electrostatic sheet 823 is molded according to any of the first to fourth examples. That is, in the electrostatic sheets 823a and 823c in the first and third examples, the dielectric layers 832a and 832c and the first electrode sheet 831 are bonded to each other through fusion-bonding of a part of the materials of the dielectric layers 832a and 832c as illustrated in FIGS. 30 and 32. In the electrostatic sheet 823b in the second example, the dielectric layer 832b and the first electrode sheet 831 are joined to each other through fusion-bonding of the first fusion-bonding material 833 that is different from the material of the dielectric layer 832b as illustrated in FIG. 31. Also, in the electrostatic sheets 823c and 823d in the third and fourth examples, the dielectric layers 832c and 832d and the first electrode sheet 831 are joined to each other through engagement of the dielectric layers 832c and 832d as illustrated in FIG. 32. In any of these examples, the dielectric layer 832 and the first electrode sheet 831 are joined to each other without using a volatilization-type adhesive and an organic solvent. Therefore, it is possible to reduce VOC discharge.

Further, the electrostatic sheet 823 is joined directly or indirectly to the core body 821. The dielectric layer 832 and the core body 821 are joined to each other according to any of the first to fourth examples. That is, in the intermediate molded articles 840a and 840c in the first and third examples, the dielectric layers 832a and 832c and the resin inner layer material 822 attached to the core body 821 are joined to each other through fusion-bonding of a part of the materials of the dielectric layers 832a and 832c as illustrated in FIGS. 33 and 35. In the intermediate molded articles 840b and 840d in the second and fourth examples, the dielectric layers 832b and 832d and the resin inner layer material 822 attached to the core body 821 are joined to each other through fusion-bonding of the second fusion-bonding material 834 that is different from the materials of the dielectric layers 832b and 832d as illustrated in FIGS. 34 and 36. In any of these examples, the dielectric layer 832 and the resin inner layer material 822 attached to the core body 821 are joined to each other without using a volatilization-type adhesive and an organic solvent. Therefore, it is also possible to reduce VOC discharge at this portion.

In addition, since the electrostatic sheet 823 is joined to the core body 821 or the resin inner layer material 822 attached to the core body 821 as described above, it is possible to apply injection molding or the like to molding of the resin outer layer material 824. Therefore, manufacturing costs for the steering wheel 18 are reduced as compared with a case in which sewing is performed.

24. Steering Wheel 18 in Second Example (24-1. Detailed Configuration of Steering Wheel 18)

A detailed configuration of a steering wheel 18 in a second embodiment will be described with reference to FIGS. 37 and 38. In particular, detailed configuration of a gripping portion 912 will be described.

The gripping portion 912 includes a core body 921 that serves as a conducive member, a resin inner layer material 822, an electrostatic sheet 923, and the resin outer layer material 824. The gripping portion 912 in the second example is different from that in the first example only in the core body 921 and the electrostatic sheet 923, and the other configurations thereof are the same. The core body 921 is connected to a ground potential. In this example, the core body 921 functions as a shield electrode for the electrostatic sheet 923 instead of the electrode that forms an electrostatic capacitance of an electrostatic capacitive sensor.

The electrostatic sheet 923 is formed into a sheet shape. The electrostatic sheet 923 is provided so as to be wound around the outer surfaces of the core body 921 and the resin inner layer material 822 from the outer side of the gripping portion 912 in the radial direction (the outer side in the radial direction in FIG. 24 and the upper side in FIG. 37) toward the inner side in the radial direction (the inner side in the radial direction in FIG. 24 and the lower side in FIG. 37) when seen in the penetrating direction (the direction in FIG. 24) of the gripping portion 912. Therefore, a state in which both edges of the electrostatic sheet 923 in the width direction are caused to confront with each other at a portion on the inner side of the gripping portion 912 in the radial direction (the inner side in the radial direction in FIG. 24 and the lower side in FIG. 37) is achieved. Alternatively, a state in which both edges of the electrostatic sheet 923 face each other with a slight gap at a portion on the inner side of the gripping portion 912 in the radial direction (the inner side in the radial direction in FIG. 24 and the lower side in FIG. 37) is achieved.

In addition, the electrostatic sheet 923 is molded into a preliminary shape corresponding to the curved surface shape of the outer surface of the core body 921 in the process of manufacturing the steering wheel 18. That is, the electrostatic sheet 923 is molded such that the section thereof at a right angle relative to the axis is a C shape as illustrated in FIG. 38 and is molded into a shape corresponding to the ring front shape of the core body 921 as illustrated in FIG. 24.

The electrostatic sheet 923 includes the first electrode sheet 831, the dielectric layer 832, and a second electrode sheet 936. The first electrode sheet 831 and the second electrode sheet 936 function as a pair of electrodes that form an electrostatic capacitance of an electrostatic capacitive sensor (transducer). The dielectric layer 832 functions as a dielectric layer of the electrostatic capacitance of the electrostatic capacitive sensor (transducer).

The second electrode sheet 936 is a conductive cloth that is similar to the first electrode sheet 831 as illustrated in FIG. 2, for example. The second electrode sheet 936 includes the plurality of second through-holes 22a as illustrated in FIG. 2, has flexibility, and is stretchable by forming the cloth using fiber. A stretchable punching metal thin film with flexibility can also be applied to the second electrode sheet 936 as well as the second conductive cloth. In this case, the through-holes 22a correspond to punched portions.

The second electrode sheet 936 is disposed on the side of the second surface (the inner surface in FIGS. 37 and 38) of the dielectric layer 832. The dielectric layer 832 on the side of the second surface is joined directly or indirectly to the second electrode sheet 936 through any of (0 fusion-bonding of a part of the material of the dielectric layer 832, (g) fusion-bonding of a third fusion-bonding material 937 (which will be described later) that is different from the material of the dielectric layer 832, and (h) engagement of the dielectric layer 832 itself.

Further, the dielectric layer 832 on the side of the second surface is joined directly or indirectly to the core body 921 through any of (d) fusion-bonding of a part of the material of the dielectric layer 832 and (e) fusion-bonding of a second fusion-bonding material 939 (which will be described later) that is different from the dielectric layer 832 similar to the first example. Here, since the resin inner layer material 822 covers the outer surface of the core body 921 in this example, the second surface of the dielectric layer 832 is joined directly or indirectly to the resin inner layer material 822 on the side of the outer surface.

Figure 37:
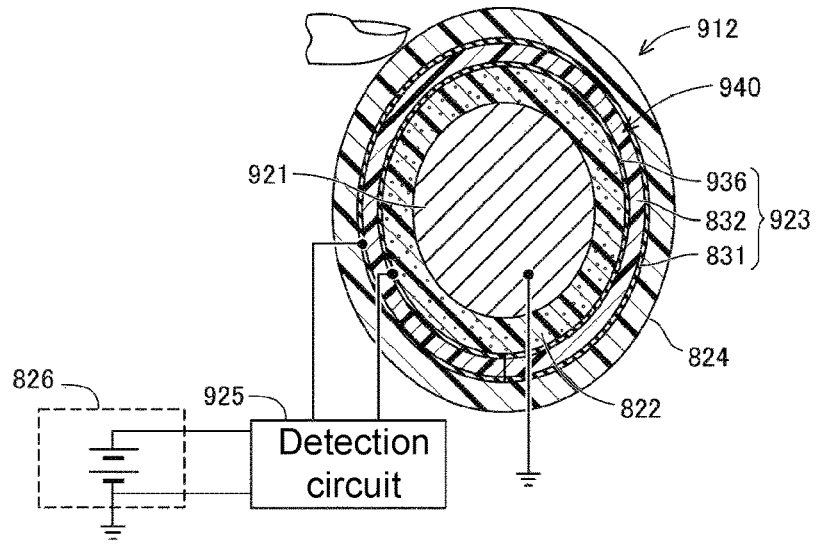
FIG. 37 illustrates an enlarged view of a section of the steering wheel in a second example taken along II-II (a section at a right angle relative to the axis) in FIG. 24 and illustrates a detection block diagram.
Figure 38:
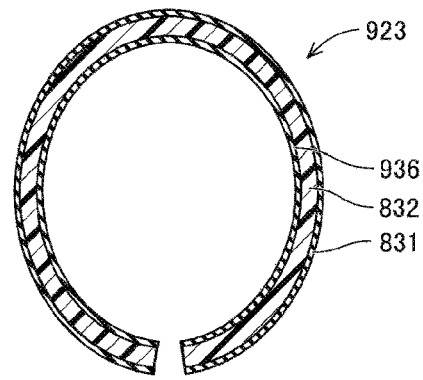
FIG. 38 is a sectional view at a right angle relative to an axis of an electrostatic sheet molded into a preliminary shape.

The steering wheel 18 includes a detection circuit 925 as illustrated in FIG. 37. The detection circuit 925 is operated by electric power supplied from the power source 826. The detection circuit 925 is electrically connected to the first electrode sheet 831 and the second electrode sheet 936 and detects contact or approach of driver's hands on the basis of a change in electrostatic capacitance between the first electrode sheet 831 and the second electrode sheet 936. Since details of a method of detecting the electrostatic capacitance using the detection circuit 925 is known, description thereof will be omitted.

Here, the second electrode sheet 936 may cause a potential difference depending on portions in practice although the second electrode sheet 936 ideally has the same potential regardless of portions. In addition, the second electrode sheet 936 is formed into an annular shape in the section at a right angle relative to an axis as illustrated in FIG. 38. Therefore, there is a concern that in a case in which the second electrode sheet 936 itself has a potential difference depending on portions, the electrostatic capacitance depending on the potential difference of the second electrode sheet 936 itself affect detection values. Also, there is a concern that noise due to electrostatic coupling or the like to the first electrode sheet 831 and the second electrode sheet 936 from the side of the core body 921 affects detection values. Thus, the core body 921 is caused to function as a shield electrode, thereby reducing these influences.

(24-2. Detailed Configuration of Electrostatic Sheet 923)

Next, a configuration of the electrostatic sheet 923 will be described in detail. The electrostatic sheet 923 is molded in the electrostatic sheet molding process in S2 in FIG. 26 and is a member in which the first electrode sheet 831 and the dielectric layer 832 are joined to each other as described above. As the electrostatic sheet 923, any of an electrostatic sheet 923a in a first example, an electrostatic sheet 923b in a second example, an electrostatic sheet 923c in a third example, and an electrostatic sheet 923d in a fourth example can be applied as described below.

(24-2-1. Configuration of Electrostatic Sheet 923a in First Example)

Figure 39:
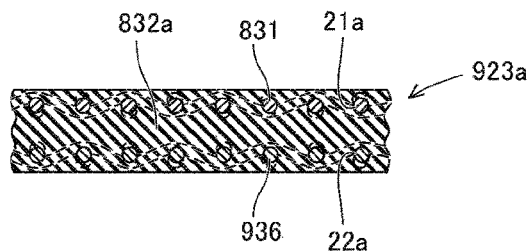
FIG. 39 is a sectional view of an electrostatic sheet in a first example.

The electrostatic sheet 923a in the first example will be described with reference to FIG. 39. The electrostatic sheet 923a in the first example has a configuration that is similar to that of the electrostatic sheet 823a of the first example in the first example and is configured to further have the second electrode sheet 936. The same reference numerals will be used to denote components the same in both the examples.

The electrostatic sheet 923a in the first example includes the first electrode sheet 831, the dielectric layer 832a in the first example, and the second electrode sheet 936. The dielectric layer 832a on the side of the second surface (the lower surface in FIG. 39) is joined directly to the second electrode sheet 936 through fusion-bonding of a part of the material of the dielectric layer 832a in a state in which the second electrode sheet 936 is buried therein. That is, all the second electrode sheet 936 on the side of the inner surface (the lower surface in FIG. 39), the inner circumferential surfaces of the second through-holes 22a in the second electrode sheet 936, and the second electrode sheet 936 on the side of the outer surface (the upper surface in FIG. 39) are fusion-bonded to the body portion of the dielectric layer 832a.

The electrostatic sheet 923a in the first example is molded as follows, for example. The first electrode sheet 831, the material of the dielectric layer 832a, and the second electrode sheet 936 are prepared. The first electrode sheet 831 is laminated on the first surface of the material of the dielectric layer 832a. Further, the second electrode sheet 936 is laminated on the second surface of the material of the dielectric layer 832a. In this state, the laminated body is caused to enter between a pair of pressurization and heating rollers (not illustrated). That is, heat from the pair of pressurization and heating rollers is delivered to the first surface and the second surface of the material of the dielectric layer 832a, and the material is melted. Thus, the first electrode sheet 831 is buried from and in the first surface of the material of the dielectric layer 832a. Further, the second electrode sheet 936 is buried from and in the second surface of the material of the dielectric layer 832a. In addition, the dielectric layer 832a on the side of the first surface is fusion-bonded to the first electrode sheet 831, and the dielectric layer 832a on the side of the second surface is fusion-bonded to the second electrode sheet 936 with solidification of the material of the dielectric layer 832a. In this manner, the electrostatic sheet 923a in the first example is molded.

(24-2-2. Configuration of Electrostatic Sheet 923b in Second Example)

Figure 40:
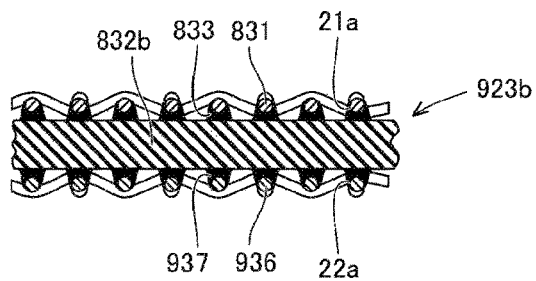
FIG. 40 is a sectional view of an electrostatic sheet in a second example.

The electrostatic sheet 923b in the second example will be described with reference to FIG. 40. The electrostatic sheet 923b in the second example has a configuration that is similar to that of the electrostatic sheet 823b of the second example in the first example and has a configuration further including the second electrode sheet 936. The same reference numerals will be used to denote components the same in both the examples.

The electrostatic sheet 923b in the second example includes the first electrode sheet 831, the dielectric layer 832b in the second example, and the second electrode sheet 936. The dielectric layer 832b on the side of the second surface (the lower surface in FIG. 40) is joined indirectly to the second electrode sheet 936 through fusion-bonding of the third fusion-bonding material 937. That is, the third fusion-bonding material 937 is interposed between the second electrode sheet 936 and the dielectric layer 832b. In addition, the third fusion-bonding material 937 is fusion-bonded to the second electrode sheet 936 on the side of the outer surface (the upper surface in FIG. 40) and at least some of the inner circumferential surfaces of the second through-holes 22a in the second electrode sheet 936 and is also fusion-bonded to the dielectric layer 832b on the side of the second surface.

The electrostatic sheet 923b in the second example is molded as follows, for example. First, an integrated member of the first electrode sheet 831 and the dielectric layer 832b is molded. That is, the first electrode sheet 831 and the dielectric layer 832b are bonded to each other with the first fusion-bonding material 833. Next, the integrated member of the first electrode sheet 831 and the dielectric layer 832b, the second electrode sheet 936, and the third fusion-bonding material 937 are prepared. The third fusion-bonding material 937 is formed in the form of fine particles or minute sheets, for example. In addition, the second electrode sheet 936 is laminated on the dielectric layer 832b on the side of the surface of the second surface, and the third fusion-bonding material 937 is disposed between the surface of the second surface of the dielectric layer 832b and the second electrode sheet 936. In this state, the laminated body is caused to enter between a pair of pressurization and heating rollers (not illustrated). That is, heat from the pair of pressurization and heating rollers is delivered to the third fusion-bonding material 937, and the third fusion-bonding material 937 is melted. Thus, the melted third fusion-bonding material 937 joins the second electrode sheet 936 and the dielectric layer 832b. In this manner, the electrostatic sheet 923b in the second example is molded.

(24-2-3. Configuration of Electrostatic Sheet 923c in Third Example)

Figure 41:
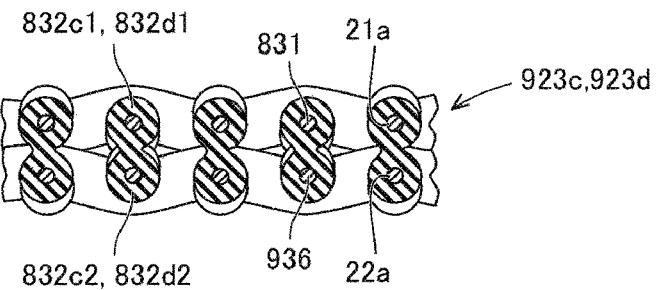
FIG. 41 is a sectional view of electrostatic sheets in third and fourth examples.

The electrostatic sheet 923c in the third example will be described with reference to FIG. 41. The electrostatic sheet 923c in the third example has a configuration including dielectric layers 832c1 and 832c2 in the third example that have a configuration similar to that of the electrostatic sheet 823c of the third example in the first example. The same reference numerals will be provided to the same configurations in both the examples.

The electrostatic sheet 923c in the third example includes the first electrode sheet 831, the dielectric layers 832c1 and 832c2 in the third example, and the second electrode sheet 936. The dielectric layer 832c1 is similar to the dielectric layer 32c in the first example. The dielectric layer 832c2 is applied, as a coating, to the surface of the second electrode sheet 936 such that the plurality of second through-holes 22a (illustrated in FIG. 2) in the second electrode sheet 936 are maintained. For example, the dielectric layer 832c2 is formed integrally with the second electrode sheet 936 by causing the thermoplastic material in a melted state to adhere to the entire surface of the conductive fiber of the second electrode sheet 936 through dipping, spraying, coating, or the like. That is, the dielectric layer 832c2 adheres to all the second electrode sheet 936 on the side of the inner surface (the lower surface in FIG. 41), the inner circumferential surfaces of the second through-holes 22a in the second electrode sheet 936, and the second electrode sheet 936 on the side of the outer surface (the upper surface in FIG. 41). Here, a state in which the second through-holes 22a penetrate through the second electrode sheet 936 is maintained in a state in which the dielectric layer 832c2 adheres thereto.

Since the dielectric layer 832c2 is formed from a thermoplastic material, the dielectric layer 832c2 is joined directly to the second electrode sheet 936 through fusion-bonding of a part of the material of the dielectric layer 832c2. Further, the dielectric layer 832c2 is joined directly to the second electrode sheet 936 through engagement of the dielectric layer 832c2 itself. Here, the engagement means that the dielectric layer 832c2 gets mechanically caught therein.

Further, the dielectric layers 832c1 and 832c2 are joined to each other through fusion-bonding of a part of the material of the dielectric layers 832c1 and 832c2 themselves. In addition, the dielectric layers 832c1 and 832c2 may be formed integrally with the first electrode sheet 831 and the second electrode sheet 936 through dipping, spraying, coating, or the like of the thermoplastic material in a melted state in a state in which the first electrode sheet 831 and the second electrode sheet 936 are disposed with a distance therebetween.

(24-2-4. Configuration of Electrostatic Sheet 923d in Fourth Example)

The electrostatic sheet 923d in the fourth example will be described with reference to FIG. 41. The electrostatic sheet 923d in the fourth example includes the first electrode sheet 831, dielectric layers 832d1 and 832d2 in the fourth example, and the second electrode sheet 936. The dielectric layers 832d1 and 832d2 are formed from non-thermoplastic materials, in particular, non-thermoplastic elastomers. The dielectric layers 832d1 and 832d2 in the fourth example are similar to the dielectric layers 832c1 and 832c2 in the third example other than that the dielectric layers 832d1 and 832d2 are formed from the non-thermoplastic materials. In addition, the dielectric layers 832d1 and 832d2 may be joined to each other through fusion-bonding of a fusion-bonding material, which is not illustrated in the drawing.

(24-3. Configuration of Intermediate Molded Article 940 of Gripping Portion 912)

Next, a configuration of an intermediate molded article 940 (the configuration corresponding to FIG. 29 in the first example) of the gripping portion 912 will be described in detail. The intermediate molded article 940 of the gripping portion 912 is molded in the electrostatic sheet joining process in S3 in FIG. 26 as described above and is a member in which the core body 921, the resin inner layer material 822, and the electrostatic sheet 923 are integrated.

As the intermediate molded article, any of an intermediate molded article 940a in a first example, an intermediate molded article 940b in a second example, an intermediate molded article 940c in a third example, and an intermediate molded article 940d in a fourth example can be applied as will be described below. Here, any of the electrostatic sheet 923a in the first example (FIG. 39), the electrostatic sheet 923b in the second example (FIG. 40), the electrostatic sheet 923c in the third example (FIG. 41), and the electrostatic sheet 923d in the fourth example (FIG. 41) can be applied as the electrostatic sheet 923 as described above. The intermediate molded articles 940a, 940b, 940c, and 940d correspond to cases in which the electrostatic sheets 923a, 923b, 923c, and 923d are applied, respectively.

(24-3-1. Configuration of Intermediate Molded Article 940a in First Example)

Figure 42:
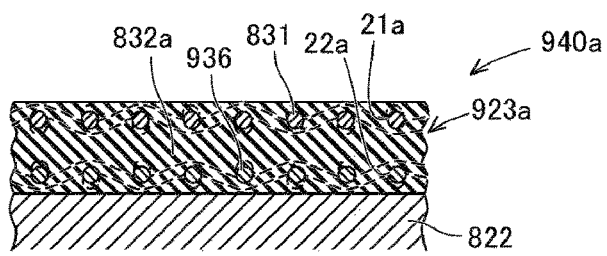
FIG. 42 is a sectional view of an intermediate molded article in a first example.

The intermediate molded article 940a in the first example will be described with reference to FIG. 42. The intermediate molded article 940a in the first example includes the electrostatic sheet 923a in the first example. The dielectric layer 32a in the electrostatic sheet 923a in the first example is formed from a thermoplastic material. In addition, the dielectric layer 32a on the side of the second surface (the lower surface in FIG. 42) is joined directly to the outer surface of the resin inner layer material 822 through fusion-bonding of a part of the material of the dielectric layer 32a.

The intermediate molded article 940a in the first example is molded as follows, for example. The electrostatic sheet 923a with a section at a right angle relative to an axis formed into a C shape is disposed in the circumference of the core body 921 and the resin inner layer material 822. Thereafter, hot wind is applied to the electrostatic sheet 923a from the outer side, and the dielectric layer 832a is thus deformed such that the dielectric layer 832a follows the shape of the outer surface of the resin inner layer material 822. At the same time, a part of the material of the dielectric layer 832a is melted due to the hot wind, and the dielectric layer 832a is joined directly to the resin inner layer material 822 through fusion-bonding of a part of the material of the dielectric layer 832a. In this manner, the intermediate molded article 940a is molded.

(24-3-2. Configuration of Intermediate Molded Article 940b in Second Example)

Figure 43:
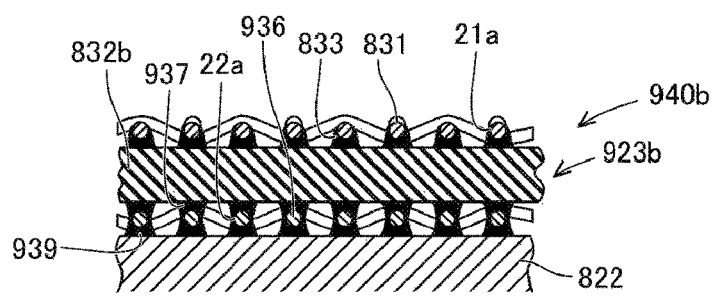
FIG. 43 is a sectional view of an intermediate molded article in a second example.

The intermediate molded article 940b in the second example will be described with reference to FIG. 43. The intermediate molded article 940b in the second example includes the electrostatic sheet 923b in the second example. The dielectric layer 832b in the electrostatic sheet 923b in the second example is formed from a non-thermoplastic material. The electrostatic sheet 923b on the side of the second surface (the surface on the side of the second electrode sheet 936) is joined indirectly to the outer surface of the resin inner layer material 822 through fusion-bonding of the second fusion-bonding material 939. That is, the second fusion-bonding material 939 is interposed between the outer surface of the resin inner layer material 822 and the second surface of the electrostatic sheet 923b.

The intermediate molded article 940b in the second example is molded as follows, for example. The electrostatic sheet 923b with the section at a right angle relative to an axis formed into a C shape is disposed in the circumference of the core body 921 and the resin inner layer material 822. At this time, the second fusion-bonding material 939 is disposed between the outer surface of the resin inner layer material 822 and the second surface of the electrostatic sheet 923b. The second fusion-bonding material 939 is formed in the form of fine particles or minute sheets, for example. Hot wind is applied to the electrostatic sheet 923b from the outer side in this state, the second fusion-bonding material 939 is thus melted, and the electrostatic sheet 923b is joined indirectly to the resin inner layer material 822 through fusion-bonding of the second fusion-bonding material 939. In this manner, the intermediate molded article 940b is molded.

(24-3-3. Configuration of Intermediate Molded Article 940c in Third Example)

Figure 44:
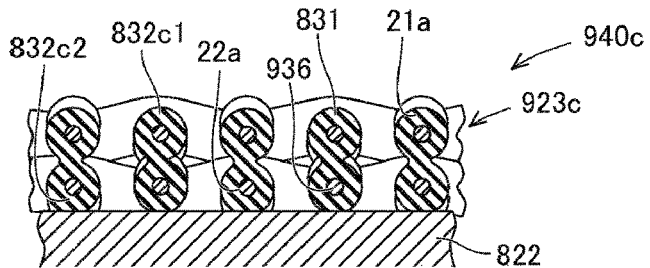
FIG. 44 is a sectional view of an intermediate molded article in a third example.

The intermediate molded article 940c in the third example will be described with reference to FIG. 44. The intermediate molded article 940c in the third example includes the electrostatic sheet 923c in the third example. The dielectric layers 832c1 and 832c2 in the electrostatic sheet 923c in the third example are formed from thermoplastic materials. In addition, the electrostatic sheet 923c on the side of the second surface (the surface on the side of the dielectric layer 832c2) is joined directly to the outer surface of the resin inner layer material 822 through fusion-bonding of a part of the material of the dielectric layer 832c2.

The intermediate molded article 940c in the third example is molded as follows, for example. The electrostatic sheet 923c with the section at a right angle relative to an axis formed into a C shape is disposed in the circumference of the core body 921 and the resin inner layer material 822. Thereafter, hot wind is applied to the electrostatic sheet 923c from the outer side, and the dielectric layers 832c1 and 832c2 are thus deformed such that the dielectric layers 832c1 and 832c2 follow the shape of the outer surface of the resin inner layer material 822. At the same time, a part of the material of the dielectric layer 832c2 is melted due to the hot wind, and the dielectric layer 832c2 is joined directly to the resin inner layer material 822 through fusion-bonding of a part of the material of the dielectric layer 832c2. In this manner, the intermediate molded article 940c is molded.

(24-3-4. Configuration of Intermediate Molded Article 940d in Fourth Example)

Figure 45:
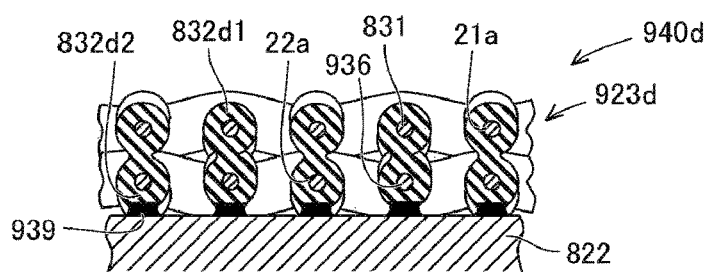
FIG. 45 is a sectional view of an intermediate molded article in a fourth example.

The intermediate molded article 940d in the fourth example will be described with reference to FIG. 45. The intermediate molded article 940d in the fourth example includes the electrostatic sheet 923d in the fourth example. The dielectric layers 832d1 and 832d2 in the electrostatic sheet 923d in the fourth example are formed from non-thermoplastic materials. The electrostatic sheet 923d on the side of the second surface (the surface on the side of the dielectric layer 832d2) is joined indirectly to the outer surface of the resin inner layer material 822 through fusion-bonding of the second fusion-bonding material 939. That is, the second fusion-bonding material 939 is interposed between the outer surface of the resin inner layer material 822 and the second surface of the electrostatic sheet 923d.

The intermediate molded article 940d in the fourth example is molded as follows, for example. The electrostatic sheet 923d with the section at a right angle relative to an axis formed into a C shape is disposed in the circumference of the core body 921 and the resin inner layer material 822. At this time, the second fusion-bonding material 939 is disposed between the outer surface of the resin inner layer material 822 and the second surface of the electrostatic sheet 923d. The second fusion-bonding material 939 is formed in the form of fine particles or minute sheets, for example. Hot wind is applied to the electrostatic sheet 923d from the outer side in this state, the second fusion-bonding material 939 is thus melted, and the dielectric layer 832d2 is joined indirectly to the resin inner layer material 822 through fusion-bonding of the second fusion-bonding material 939. In this manner, the intermediate molded article 940d is molded.

25. Effects

Here, the steering wheel 18 in the second example exhibits effects that are similar to those in the first example and further exhibits the following effects. The electrostatic sheet 923 in the second example includes the first electrode sheet 831, the dielectric layer 832, and the second electrode sheet 936. The electrostatic sheet 923 is molded according to any of the first to fourth examples. That is, the dielectric layers 832a and 832c2 and the second electrode sheet 936 are joined to each other through fusion-bonding of a part of materials of the dielectric layers 832a and 832c2 in the electrostatic sheets 923a and 923c in the first and third examples as illustrated in FIGS. 39 and 41. As illustrated in FIG. 40, the dielectric layer 832b and the second electrode sheet 936 are joined to each other through fusion-bonding of the third fusion-bonding material 937 that is different from the material of the dielectric layer 832b in the electrostatic sheet 923b in the second example. Also, the dielectric layers 832c2 and 832d2 and the second electrode sheet 936 are joined to each other through engagement of the dielectric layers 832c2 and 832d2 in the electrostatic sheets 923c and 923d in the third and fourth examples as illustrated in FIG. 41. In any of these examples, the dielectric layer 832 and the second electrode sheet 936 are joined to each other without using a volatilization-type adhesive and an organic solvent. Therefore, it is possible to reduce VOC discharge.

Further, the electrostatic sheet 923 is joined directly or indirectly to the core body 921. The dielectric layer 832 and the core body 921 are joined to each other according to any of the first to fourth examples. That is, the dielectric layers 832a and 832c2 and the resin inner layer material 822 attached to the core body 921 are joined to each other through fusion-bonding of a part of the materials of the dielectric layers 832a and 832c2 in the intermediate molded articles 940a and 940c in the first and third examples as illustrated in FIGS. 42 and 44. As illustrated in FIGS. 43 and 45, the dielectric layers 832b and 832d2 and the resin inner layer material 822 attached to the core body 921 are joined to each other through fusion-bonding of the second fusion-bonding material 939 that is different from the materials of the dielectric layers 832b and 832d2 in the intermediate molded articles 940b and 940d in the second and fourth examples. In any of these examples, the dielectric layer 832 and the resin inner layer material 822 attached to the core body 921 are joined to each other without using a volatilization-type adhesive and an organic solvent. Therefore, it is also possible to reduce VOC discharge at this portion.

Although the electrostatic sheet 923 is a preliminary molded article with the section at a right angle relative to an axis formed into a C shape in the second example, the sectional shape may be a planar shape. In addition, the core body 921 is a conductive member that serves as a shield electrode, the core body 921 may be a non-conductive member in a case in which there are less influences on detection values. In addition, the core body 921 may be a non-conductive member, and another conductive member may be interposed between the core body 921 and the second electrode sheet 936.

What is claimed is:

1. A sensor comprising:
   a first electrode sheet provided with a plurality of first through-holes;
   a dielectric layer with a first surface that is disposed on a side of the first electrode sheet, wherein the dielectric layer is formed from a thermoplastic material; and
   a first fusion-bonding layer formed from a fusion-bonding material, wherein the first fusion-bonding layer joining together, by fusion-bonding of the fusion-bonding material, a boundary region between a body portion of the dielectric layer and a first inner surface of the first electrode sheet and a boundary region between the body portion of the dielectric layer and a first inner circumferential surface of at least some of the plurality of first through-holes,
   the first fusion-bonding layer applies a part of the dielectric layer as the fusion-bonding material and bonds the respective boundary regions through fusion-bonding of the part of the dielectric layer, and the first fusion-bonding layer is formed from the same material constituent as that of the dielectric layer, and, wherein the first fusion-bonding layer blocks the plurality of first through-holes.

2. The sensor according to claim 1, wherein the first fusion-bonding layer causes fusion-bonding in an entire range in which the body portion of the dielectric layer faces the first inner surface of the first electrode sheet.

3. The sensor according to claim 1,
wherein the first electrode sheet is stretchable in a surface direction,
the dielectric layer is formed from a thermoplastic elastomer, and
an electrostatic sheet that includes the first electrode sheet and the dielectric layer is stretchable in the surface direction.

4. The sensor according to claim 1, wherein a minimum opening length of the plurality of first through-holes in the first electrode sheet is equal to or greater than 150 μm.

5. The sensor according to claim 1, wherein an opening area of the plurality of first through-holes in the first electrode sheet is equal to or greater than 6400 μm$^2$.

6. A transducer comprising:
a first electrode sheet provided with a plurality of first through-holes;
a dielectric layer with a first surface that is disposed on a side of the first electrode sheet; and
a first fusion-bonding layer formed from a fusion-bonding material, wherein the first fusion-bonding layer joining together, by fusion-bonding of the fusion-bonding material, a boundary region between a body portion of the dielectric layer and a first inner surface of the first electrode sheet and a boundary region between the body portion of the dielectric layer and a first inner circumferential surface of at least some of the plurality of first through-holes,
wherein the first electrode sheet further includes a slit that is formed so as to be longer than an opening length of the first through-hole and that allows the first electrode sheet to be stretched in a main direction through expanding deformation, and
a portion of the slit is filled with the dielectric layer, and the dielectric layer is stretched in the main direction with the expanding deformation of the slit in the main direction.

7. The transducer according to claim 6, wherein the first electrode sheet includes a plurality of the slits in the main direction.

8. The transducer according to claim 6, wherein the slit extends in a direction at an angle relative to the main direction.

9. The transducer according to claim 6, wherein the slit is formed at a center in a sub direction that perpendicularly intersects the main direction, and are not formed at both ends in the sub direction.

10. The transducer according to claim 6, wherein the slit is formed at both ends in a sub direction that perpendicularly intersects with the main direction, and are not formed at a center in the sub direction.

11. The transducer according to claim 6, wherein the slit is formed so as to connect two positions at an outer edge of the first electrode sheet and divide a detection region using the first electrode sheet into a plurality of regions.

12. The transducer according to claim 6, wherein the slit is formed so as to have a region in a state in which the first electrode sheet is not stretched.

13. The transducer according to claim 6, wherein the slit is linearly formed in a state in which the first electrode sheet is not stretched.

14. The transducer according to claim 6,
wherein the slit is formed so as to be longer than an opening length of the first through-holes in the main direction and allow the first electrode sheet to be stretched in a sub direction that perpendicularly intersects with the main direction and by expanding deformation in the sub direction, and
the dielectric layer is disposed at a portion corresponding to the slit and is stretched in the sub direction with the expanding deformation of the slit in the sub direction.

15. The sensor according to claim 1, further comprising:
a first lead line that is sandwiched between the first inner surface of the first electrode sheet and the body portion of the dielectric layer, and that extends from a portion between the first inner surface of the first electrode sheet and the body portion of the dielectric layer to a position that is non-overlapped with the first electrode sheet and the dielectric layer.

16. The sensor according to claim 15, wherein a conductive portion of the first lead line is entwined around the first electrode sheet via the first through-holes.

17. The sensor according to claim 15, further comprising:
a first fixing layer that fixes a conductive portion of the first lead line to the first electrode sheet in an electrically connected state, and that is formed from a conductive joining material.

18. The sensor according to claim 1, further comprising:
a second electrode sheet provided with a plurality of second through-holes and disposed on a side of a second surface of the dielectric layer; and
a second fusion-bonding layer formed from a fusion-bonding material, wherein the second fusion-bonding layer joining together, by fusion-bonding of the fusion-bonding material, a boundary region between a body portion of the dielectric layer and a second inner surface of the second electrode sheet and a boundary region between the body portion of the dielectric layer and a second inner circumferential surface of at least some of the plurality of second through-holes,
wherein the second fusion-bonding layer applies a part of the dielectric layer as the fusion-bonding material and bonds the respective boundary regions through fusion-bonding of the part of the dielectric layer, and
the second fusion-bonding layer is formed from the same material constituent as that of the dielectric layer.

19. The sensor according to claim 1, comprising:
an electrostatic sheet that includes at least the first electrode sheet, the dielectric layer, and the first fusion-bonding layer; and
a conductive member that is disposed on a side of a second surface of the dielectric layer and forms a core body of the transducer.

20. A sensor comprising:
a conductive member; and
an electrostatic sheet that is provided in a surface normal line direction of the conductive member,
wherein the electrostatic sheet includes
a first electrode sheet provided with a plurality of first through-holes, and
a dielectric layer with a first surface disposed on a side of the electrode sheet and a second surface disposed on a side of the conductive member, wherein the dielectric layer is formed from a thermoplastic material and is formed into a planar shape with no through-holes, the dielectric layer on a side of the first surface is joined directly to the first electrode sheet through fusion-bonding of a part of the material of the dielectric layer in a state in which the first electrode sheet is buried therein and in which the plurality of first through-holes is blocked, and the dielectric layer on a side of the second surface is joined directly to the conductive member through fusion-bonding of a part of the material of the dielectric layer.

21. The transducer according to claim 20, wherein the electrostatic sheet further includes a second electrode sheet provided with a plurality of second through-holes and disposed on a side of the second surface of the dielectric layer, and the dielectric layer on a side of the second surface is joined directly to the second electrode sheet through fusion-bonding of a part of a material of the dielectric layer in a state in which the second electrode sheet is buried, and is joined directly to the conductive member through fusion-bonding of a part of the material of the dielectric layer.

22. The sensor according to claim 20, further comprising:

a resin outer layer material that is injection-molded on a side of an outer surface of the electrostatic sheet on a side opposite to the conductive member.

23. The sensor according to claim 20, further comprising:

a resin inner layer material that is injection-molded on a side of an outer surface of the conductive member, wherein the dielectric layer on a side of the second surface is joined directly or indirectly to the resin inner layer material on a side of an outer surface.

24. The sensor according to claim 20, wherein the conductive member foul's a core body of the transducer.

25. The sensor according to claim 20, wherein the first electrode sheet is stretchable, the dielectric layer is formed from a thermoplastic elastomer, and the electrostatic sheet is stretchable.

26. The sensor according to claim 20, wherein the first electrode sheet and the second electrode sheet are stretchable, the dielectric layer is formed from a thermoplastic elastomer, and the electrostatic sheet is stretchable.

* * * * *